United States Patent
Park et al.

(10) Patent No.: US 11,231,992 B2
(45) Date of Patent: Jan. 25, 2022

(54) MEMORY SYSTEMS FOR PERFORMING FAILOVER

(71) Applicant: Samsung Electronics Co., Ltd., Suwon-si (KR)

(72) Inventors: Inhoon Park, Suwon-si (KR); Dong Kim, Hwaseong-si (KR); Hyunglae Eun, Seongnam-si (KR); Chulseung Lim, Suwon-si (KR); Wonyeoung Jung, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 25 days.

(21) Appl. No.: 16/793,381

(22) Filed: Feb. 18, 2020

(65) Prior Publication Data

US 2021/0026732 A1  Jan. 28, 2021

(30) Foreign Application Priority Data

Jul. 24, 2019 (KR) .......... 10-2019-0089434

(51) Int. Cl.
| | |
|---|---|
| *G06F 11/10* | (2006.01) |
| *G06F 11/14* | (2006.01) |
| *G06F 11/07* | (2006.01) |
| *G11C 11/408* | (2006.01) |
| *G11C 29/42* | (2006.01) |
| *G11C 29/00* | (2006.01) |

(52) U.S. Cl.
CPC ........ *G06F 11/1044* (2013.01); *G06F 11/076* (2013.01); *G06F 11/108* (2013.01); *G06F 11/1068* (2013.01); *G06F 11/1456* (2013.01); *G06F 11/1469* (2013.01); *G11C 11/4085* (2013.01); *G11C 29/42* (2013.01); *G11C 29/78* (2013.01)

(58) Field of Classification Search
CPC .............. G06F 11/1044; G06F 11/076; G06F 11/1068; G06F 11/108; G06F 11/1456; G06F 11/1469; G11C 11/4085; G11C 29/42; G11C 29/78
See application file for complete search history.

(56) References Cited

U.S. PATENT DOCUMENTS

| | | | | |
|---|---|---|---|---|
| 6,317,355 B1 * | 11/2001 | Kang | ............ | G11C 11/22 365/145 |
| 6,385,071 B1 * | 5/2002 | Chai | ............ | G11C 15/00 365/189.07 |

(Continued)

*Primary Examiner* — Kyle Vallecillo
(74) *Attorney, Agent, or Firm* — Harness, Dickey & Pierce, P.L.C.

(57) ABSTRACT

A memory system includes a plurality of memory devices, each of the plurality of memory devices including a plurality of memory cells, and at least one of the plurality of memory devices including a backup region, and a memory controller configured to store data to be stored in a plurality of selected memory cells in the plurality of selected memory cells and the backup region, the plurality of selected memory cells being connected to a selected word line of a selected memory device among the plurality of memory devices, and replace the selected word line with a redundancy word line to which a plurality of redundancy memory cells among the plurality of memory cells are connected in response to a correctable error correction code (CECC) occurring in at least one of the plurality of selected memory cells.

13 Claims, 24 Drawing Sheets

(56) References Cited

U.S. PATENT DOCUMENTS

| | | | |
|---|---|---|---|
| 8,041,990 B2 | 10/2011 | O'Connor et al. | |
| 8,086,783 B2 | 12/2011 | O'Connor et al. | |
| 8,386,833 B2 | 2/2013 | Smith et al. | |
| 8,495,463 B2 | 7/2013 | Miyazaki et al. | |
| 8,713,387 B2 | 4/2014 | Johnson et al. | |
| 9,058,276 B2 | 6/2015 | Stephens et al. | |
| 9,229,816 B2 | 1/2016 | Cho | |
| 9,804,920 B2 | 10/2017 | Ping et al. | |
| 10,114,557 B2 | 10/2018 | Kotte et al. | |
| 10,127,982 B2 | 11/2018 | Song | |
| 2008/0005524 A1* | 1/2008 | Worrall | G06F 12/04 711/171 |
| 2008/0123408 A1* | 5/2008 | Honma | G11C 11/5628 365/185.03 |
| 2009/0010057 A1* | 1/2009 | Tsuji | G11C 11/5621 365/185.03 |
| 2012/0254500 A1 | 10/2012 | Cho et al. | |
| 2012/0278528 A1 | 11/2012 | Galbraith et al. | |
| 2012/0327724 A1* | 12/2012 | Kawakubo | G11C 29/785 365/189.07 |
| 2016/0188404 A1* | 6/2016 | Das | G06F 11/1048 714/773 |
| 2017/0110206 A1* | 4/2017 | Ryu | G11C 29/52 |
| 2017/0270017 A1* | 9/2017 | Li | G06F 11/076 |
| 2019/0065306 A1 | 2/2019 | Margetts | |
| 2019/0355397 A1* | 11/2019 | Ishizu | G11C 14/0054 |
| 2019/0377401 A1* | 12/2019 | Maeda | G11C 5/14 |
| 2020/0194050 A1* | 6/2020 | Akamatsu | G11C 29/18 |
| 2020/0321070 A1* | 10/2020 | Hanagandi | G06F 11/1048 |

\* cited by examiner

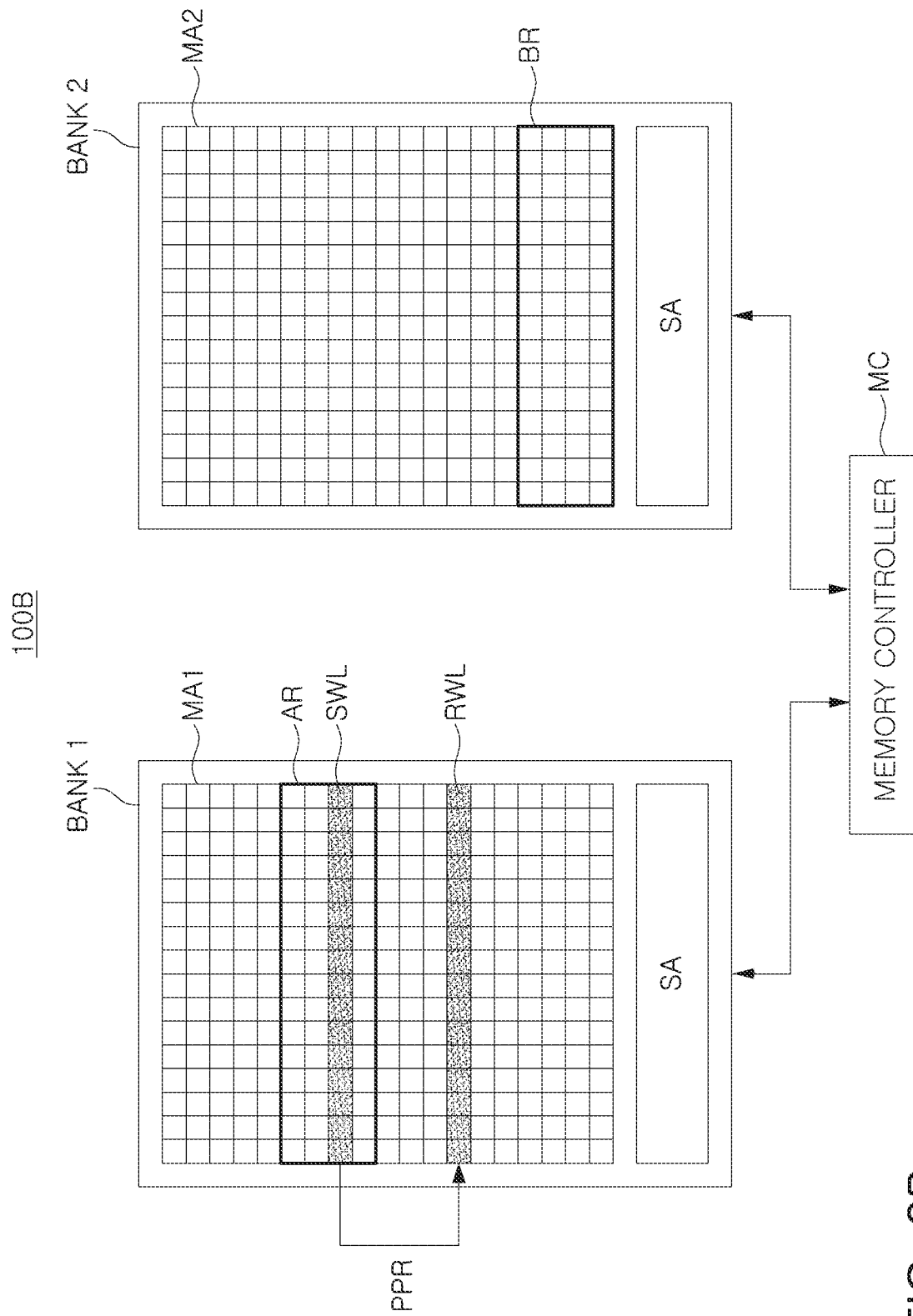

MEMORY SYSTEMS FOR PERFORMING FAILOVER

CROSS-REFERENCE TO RELATED APPLICATION(S)

This application claims benefit of priority to Korean Patent Application No. 10-2019-0089434 filed on Jul. 24, 2019 in the Korean Intellectual Property Office, the disclosure of which is incorporated herein by reference in its entirety.

BACKGROUND

1. Field

The present inventive concepts relate to a memory system.

2. Description of Related Art

The nonvolatile memory device may retain data stored in the nonvolatile memory device even when external power supply is interrupted. For example, a flash memory device is a nonvolatile memory device in which a programming operation and an erasing operation can be electrically performed. The flash memory device may be classified as a NAND-type flash memory or a NOR-type flash memory.

Volatile memory uses a constant power supply to maintain stored information. Most random access memory (RAM) for general purposes, including a dynamic RAM (DRAM) and a static RAM (SRAM), is volatile memory.

Due to a microfabrication process for a memory device such as a DRAM, a SRAM, and a flash memory, the number of defective memory cells included in the memory devices is increasing exponentially.

SUMMARY

An aspect of the present inventive concepts is to provide a memory system capable of performing a failover function, before an uncorrectable error correction code (UECC) has occurred.

According to an aspect of the present inventive concepts, a memory system includes: a plurality of memory devices, each of the plurality of memory devices including a plurality of memory cells, and at least one of the plurality of memory devices including a backup region, and a memory controller configured to store data to be stored in a plurality of selected memory cells in the plurality of selected memory cells and the backup region, the plurality of selected memory cells being connected to a selected word line of a selected memory device among the plurality of memory devices, and replace the selected word line with a redundancy word line to which a plurality of redundancy memory cells among the plurality of memory cells are connected in response to a correctable error correction code (CECC) occurring in at least one of the plurality of selected memory cells.

According to an aspect of the present inventive concepts, a plurality of memory devices, each of the plurality of memory devices including a plurality of memory cells, and at least one of the plurality of memory devices including a backup region, and a memory controller configured to, store data to be stored in a plurality of selected memory cells in each of a selected word line and the backup region, the plurality of selected memory cells being connected to the selected word line, the selected word line being included in a first region of a selected memory device among the plurality of memory devices, and replace the selected word line with a redundancy word line to which a plurality of redundancy memory cells among the plurality of memory cells are connected in response to the first region having a high access count.

According to an aspect of the present inventive concepts, a memory system includes: a memory module including a plurality of first memory devices classified as a first rank of memory devices and a plurality of second memory devices classified as a second rank of memory devices; and a memory controller configured to contemporaneously activate a first chip select signal and a second chip select signal to write data to the memory module, the first chip select signal configured to select and control the first rank of memory devices, and the second chip select signal configured to select and control the second rank of memory devices.

BRIEF DESCRIPTION OF DRAWINGS

The above and other aspects, features and other advantages of the present disclosure will be more clearly understood from the following detailed description, taken in conjunction with the accompanying drawings, in which:

FIGS. 8A to 8C are schematic views illustrating a memory system performing the operation of FIG. 6 having an active region AR and a backup region BR in different banks according to an example embodiment of the present disclosure;

DETAILED DESCRIPTION

Hereinafter, some example embodiments of the present inventive concepts will be described in detail with reference to the attached drawings.

Figure 1:
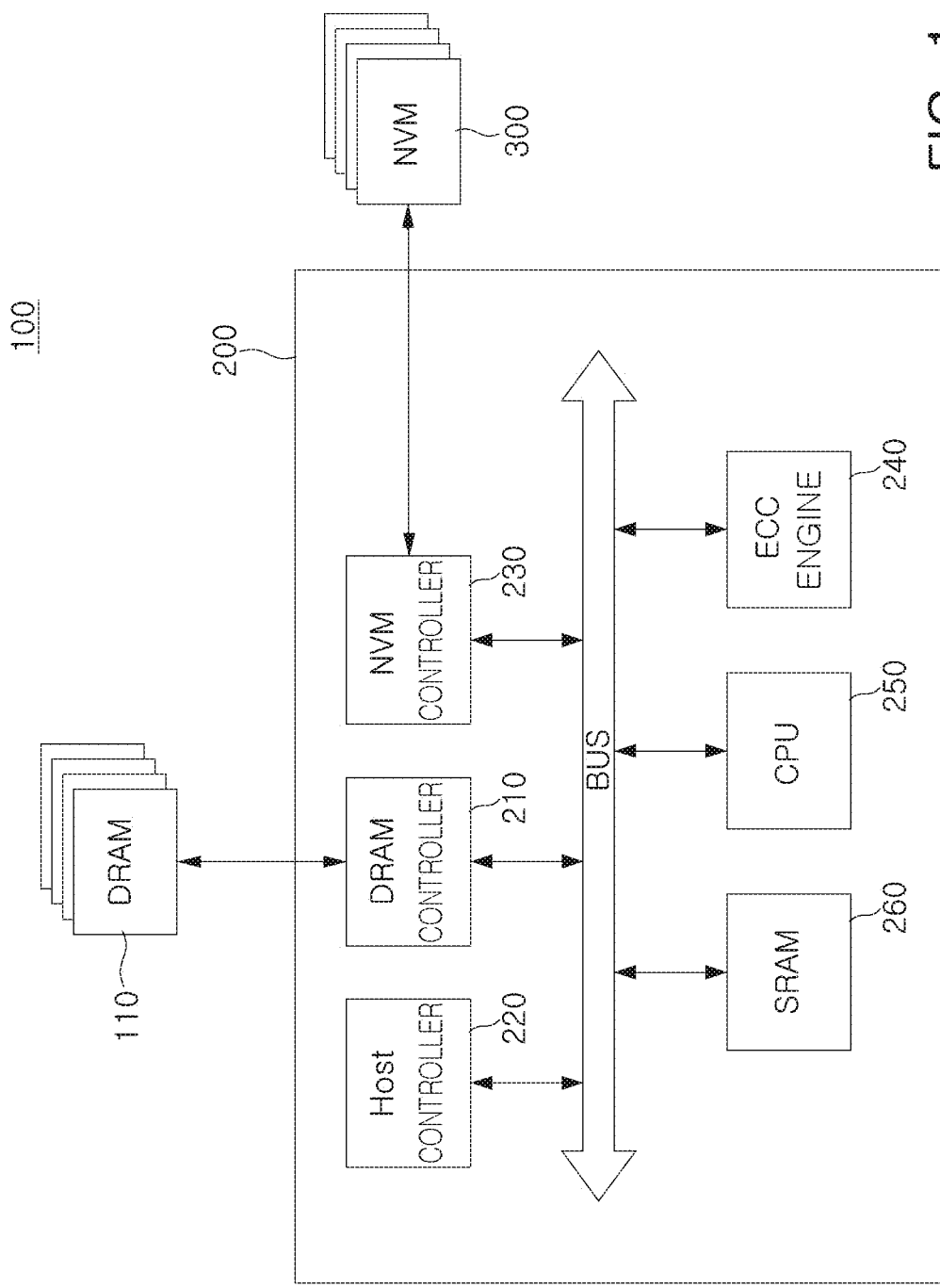
FIG. 1 is a schematic block diagram illustrating a memory system according to an example embodiment of the present disclosure.

FIG. 1 is a schematic block diagram illustrating a memory system according to an example embodiment of the present disclosure.

Referring to FIG. 1, a memory system 100 includes a first memory module 110, a memory controller 200, and/or a second memory module 300. The first memory module 110, the memory controller 200, and the second memory module 300 may be integrated into a single semiconductor device. For example, first memory module 110, the memory controller 200, and the second memory module 300 may be integrated into a single semiconductor device to form a solid state drive (SSD).

The first memory module 110 may include a volatile memory such as DRAM, synchronous DRAM (SDRAM), double data rate (DDR) SDRAM, low-power DDR (LPDDR) SDRAM, SRAM, and/or the like, and/or a nonvolatile memory such as FRAM, ReRAM, STT-MRAM, PRAM, and/or the like. The first memory module 110 may be used as a buffer memory for temporarily storing data received from a host and/or data received from the second memory module 300. According to an embodiment, the first memory module 110 may be used to store a mapping table for converting a logical address, viewed by a host, into a physical address of a flash memory.

The second memory module 300 may be implemented as a nonvolatile memory such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM), and/or the like.

The memory controller 200 may include a DRAM controller 210, a host controller 220, a nonvolatile memory (NVM) controller 230, an error correction code (ECC) engine 240, a central processing unit (CPU) 250, and/or a SRAM 260. According to some example embodiments, the DRAM controller 210, the host controller 220, the nonvolatile memory controller 230, the ECC engine 240 and/or the CPU 250 may communicate with each other and/or the SRAM 260 (e.g., via a bus).

The DRAM controller 210 may control reading and/or writing operations of the first memory module 110. For example, the DRAM controller 210 may temporarily store write data and/or read data in the first memory module 110.

The host controller 220 may process read commands and/or write commands received from the host. The host controller 220 may provide an interface for communications between the host and the CPU 250 under the control of the CPU 250. For example, the interface may be an Advanced Technology Attachment (ATA) interface, a serial ATA interface, a parallel ATA interface, and/or a Small Computer System Interface (SCSI) interface.

The nonvolatile memory controller 230 may control read operations and/or write operations of the second memory module 300.

The ECC engine 240 may include an ECC encoder and/or an ECC decoder. The ECC encoder may perform error correction encoding on data to be programmed in the second memory module 300, and may form data to which a parity bit is added. The parity bit may be stored in the second memory module 300. Moreover, the ECC decoder may perform error correction decoding on the data read from the second memory module 300. The ECC decoder may determine whether the error correction decoding succeeds, and may output an indication signal according to a determination result. The ECC decoder may correct an error bit of data using a parity bit generated during ECC encoding.

The CPU 250 may interpret a plurality of host commands coming into a command queue to read data from the second memory module 300 and/or write data to the second memory module 300 by the nonvolatile memory controller 230.

The SRAM 260 may be used for storing a code and data for firmware execution on the CPU. According to some example embodiments, operations described herein as being performed by the memory system 100, the memory controller 200, the DRAM controller 210, the host controller 220, the nonvolatile memory controller 230, the error correction code (ECC) engine 240, the ECC encoder and/or the ECC decoder may be performed by processing circuitry. The term 'processing circuitry,' as used in the present disclosure, may refer to, for example, hardware including logic circuits; a hardware/software combination such as a processor executing software (e.g., software stored in the SRAM 260); or a combination thereof. For example, the processing circuitry more specifically may include, but is not limited to, a central processing unit (CPU) (e.g., the CPU 250), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to an embodiment of the present disclosure, the ECC engine 240 may detect occurrence of a correctable error correction code (CECC) in a memory region included in the first memory module 110. The CECC may refer to a single bit error. The memory controller 200 may correct data in which the CECC occurred.

However, due to a microfabrication process for a DRAM, an uncorrectable error correction code (UECC) may occur in a memory region included in the first memory module 110. Alternatively, in the first memory module 110, a memory region in which CECC has occurred may affect a peripheral memory area resulting in a UECC. The UECC may refer to a multiple-bit error. Conventional memory controllers are unable to recover data in which the UECC occurred resulting in insufficient reliability in corresponding conventional memory systems.

However, according to an embodiment of the present disclosure, at least one of a plurality of memory devices included in the first memory module 110 may include a backup region. The memory controller 200 may determine a memory region in which the probability of occurrence of an uncorrectable error (e.g., UECC) is high. The memory controller 200 may store data to be stored in the determined memory region in each of the determined memory region and the backup region. Thus, even when a UECC occurs in a memory region, the memory controller 200 may perform a failover function using the data stored in the backup region, thereby mitigating or reducing data loss as a result of the UECC and improving the reliability of the memory system.

Moreover, when data is written on the determined memory region, the data is also written in a backup region, so a failover function may be performed in real time. That is, the failover function may be performed without stopping an operation of the memory system 100. Thus, an average mean time between failures (MTBF) may be increased, and reliability of the memory system 100 may be improved.

Figure 2:
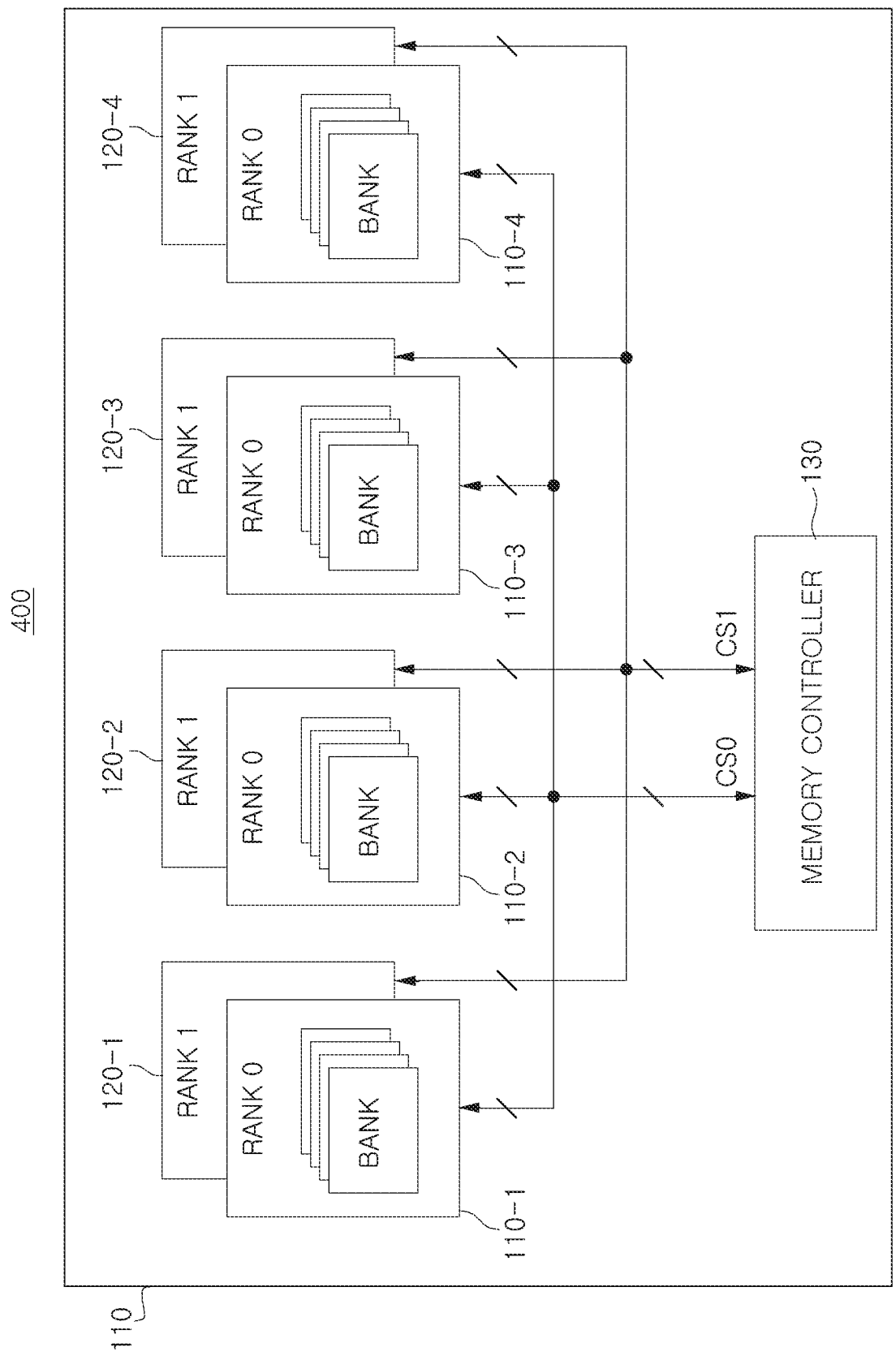
FIG. 2 is a schematic block diagram illustrating a memory system including the first memory module 110 and a memory controller 130 according to an example embodiment of the present disclosure.

FIG. 2 is a schematic block diagram illustrating a memory system 400 including the first memory module 110 and a memory controller 130 according to an example embodiment of the present disclosure.

Referring to FIG. 2, a memory system 400 includes a first memory module 110 and/or a memory controller 130. The first memory module 110 may include first memory devices 110-1 to 110-4 (e.g., the first memory device 110-1, the first memory device 110-2, the first memory device 110-3, and the first memory device 110-4) and second memory devices 120-1 to 120-4 (e.g., the second memory device 120-1, the second memory device 120-2, the second memory device 120-3, and the second memory device 120-4), configured as a multi-rank. According to some example embodiments, operations described herein as being performed by the memory controller 130 may be performed by processing circuitry. According to some example embodiments, the memory controller 130 may be the same as or similar to the memory controller 200.

The memory devices 110-1 to 110-4 and 120-1 to 120-4 may include first memory devices 110-1 to 110-4, classified as first rank RANK0, and second memory devices 120-1 to 120-4, classified as second rank RANK1. Each of the memory devices 110-1 to 110-4 and 120-1 to 120-4 may include at least one memory bank.

According to an embodiment, at least one of the first memory devices 110-1 to 110-4 and at least one of the second memory devices 120-1 to 120-4 may be included in a single memory package. For example, a first memory device 110-1 of the first memory devices 110-1 to 110-4 and a second memory device 120-1 of the second memory devices 120-1 to 120-4 may be included in a first memory package.

By the same principle, the first memory device 110-2 and the second memory device 120-2 may be included in a second memory package, the first memory device 110-3 and the second memory device 120-3 may be included in a third memory package, and the first memory device 110-4 and the second memory device 120-4 may be included in a fourth memory package.

The memory controller 130 may output a first chip select signal CS0 and/or a second chip select signal CS1. The memory controller 130 may activate a first chip select signal CS0 to select the first memory devices 110-1 to 110-4. The memory controller 130 may activate a second chip select signal CS1 to select the second memory devices 120-1 to 120-4. According to some example embodiments, the memory controller 130 may generate the first chip select signal CS0 and/or the second chip select signal CS1.

In some embodiments, the memory controller 130 may write data to the first memory devices 110-1 to 110-4. The memory controller 130 may activate a first chip select signal CS0 to select the first memory devices 110-1 to 110-4. In this case, the second chip select signal CS1 may be inactivated. For example, the first chip select signal CS0 may be activated when it is in a low state (e.g., logic low), while the second chip select signal CS1 may be inactivated when it is in a high state (e.g., logic high).

In some embodiments, the memory controller 130 may write data to the second memory devices 120-1 to 120-4. The memory controller 130 may activate a second chip select signal CS1 to select the second memory devices 120-1 to 120-4. In this case, the first chip select signal CS0 may be inactivated. For example, the second chip select signal CS1 may be activated when it is in a low state, while the first chip select signal CS0 may be inactivated when it is in a high state.

According to an embodiment of the present disclosure, at least one of the memory devices 110-1 to 110-4 and/or 120-1 to 120-4 may include a backup region. The memory system 400 (e.g., the memory controller 130) may determine a memory region having a high probability of occurrence of an uncorrectable error in the memory devices 110-1 to 110-4 and 120-1 to 120-4.

The memory system 400 (e.g., the memory controller 130) may write data to each of the memory region and the backup region, when the data is to be written to the memory region. Thus, the memory system 400 (e.g., the memory controller 130) may perform a failover function using data stored in the backup region before the UECC has occurred in the memory region.

Figure 3:
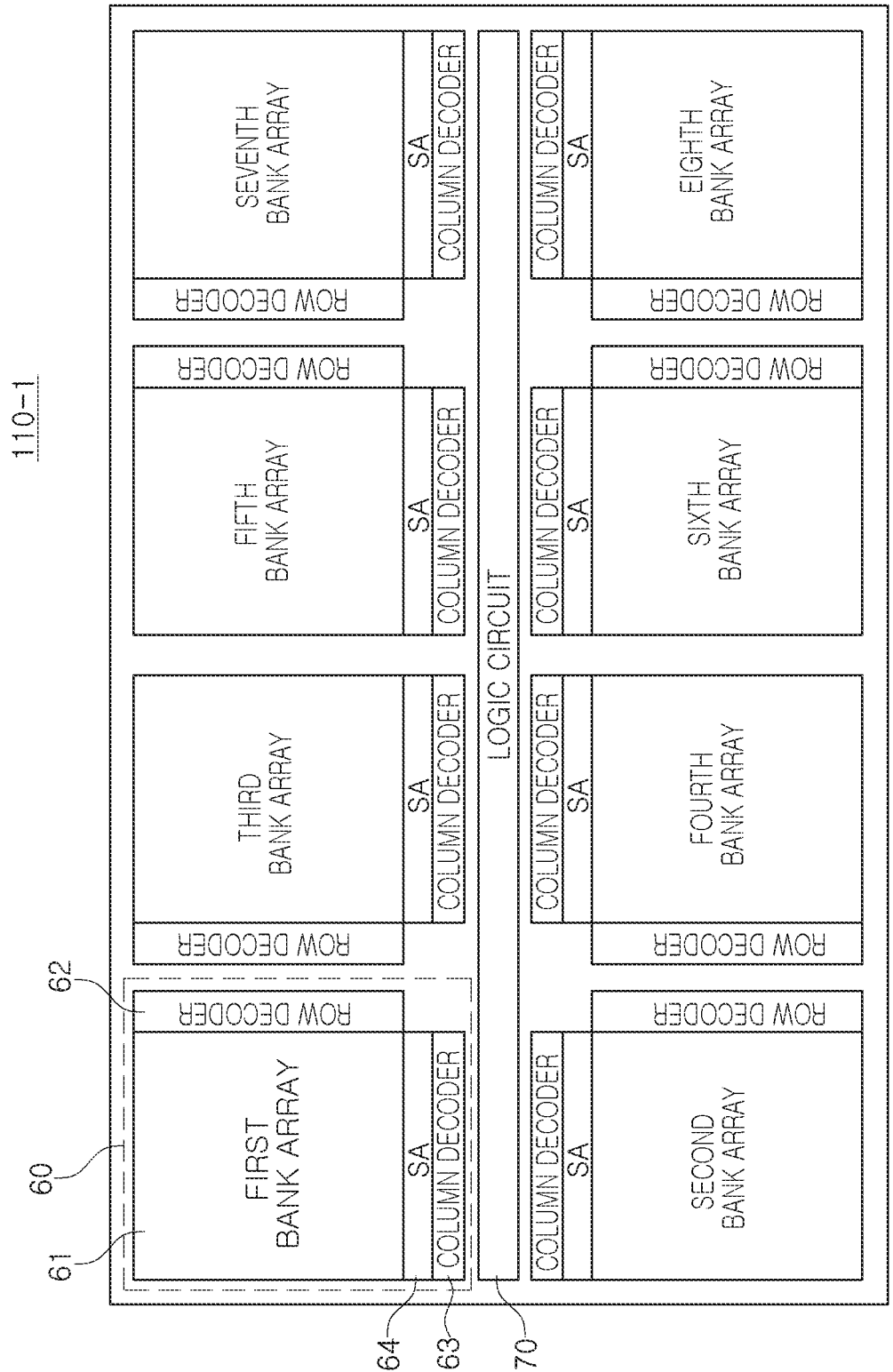
FIG. 3 is a schematic view illustrating a structure of a memory device according to an example embodiment of the present disclosure.

FIG. 3 is a schematic view illustrating a structure of a memory device according to an example embodiment of the present disclosure. Referring to FIG. 3, the first memory device 110-1 according to an example embodiment of the present disclosure includes a memory bank 60 and/or a logic circuit 70. The memory bank 60 may include a bank array 61 (e.g., the first bank array) having a plurality of memory cells, a row decoder 62, a column decoder 63, and/or a sense amplifier 64. In an embodiment, the first memory device 110-1 may include a plurality of memory banks 60. According to some example embodiments, each of the plurality of memory banks 60 may include a respective bank array (e.g., the second bank array, the third bank array, the fourth bank array, the fifth bank array, the sixth bank array, the seventh bank array and/or the eighth bank array) that may be the same as or similar to the bank array 61.

The plurality of memory banks 60, included in the first memory device 110-1, may share a single logic circuit 70. The logic circuit 70 may read data from the bank array 61, store data in the bank array 61, and/or delete data stored in the bank array 61. Moreover, the logic circuit 70 may include a control logic for controlling the row decoder 62, the column decoder 63, and/or the sense amplifier 64, in addition to a receiver and/or a transmitter, connected to input and/or output pins for transmitting and/or receiving data. According to some example embodiments, operations described herein as being performed by the row decoder 62, the column decoder 63, the sense amplifier and/or the logic circuit 70 may be performed by processing circuitry. According to some example embodiments, each of the first memory devices 110-1 to 110-4 and/or the second memory devices 120-1 to 120-4 may be similar to or the same as the first memory device 110-1.

Figure 4:
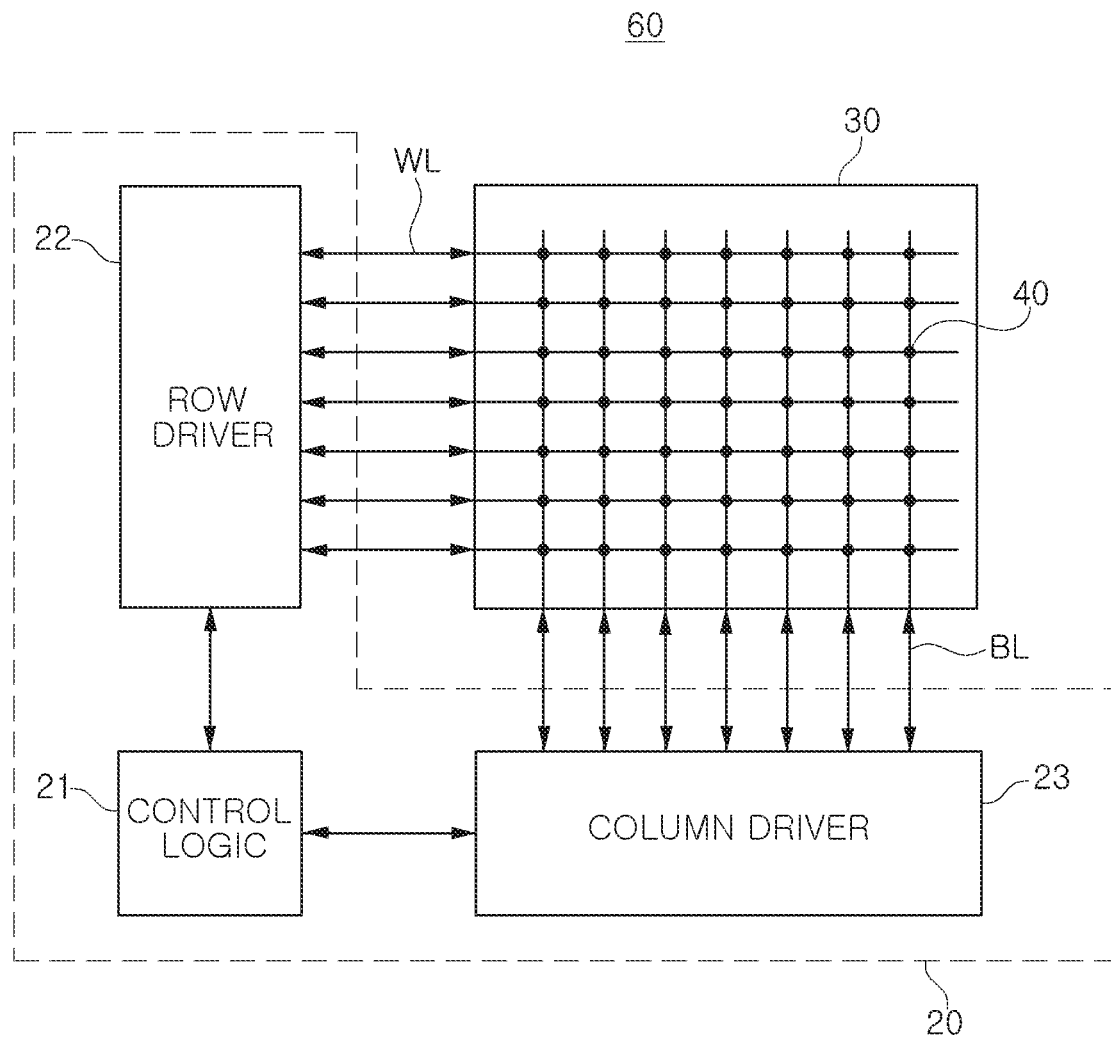
FIG. 4 is a schematic block diagram illustrating a memory bank according to an example embodiment of the present disclosure.

FIG. 4 is a schematic block diagram illustrating a memory bank according to an example embodiment of the present disclosure. Referring to FIG. 4, a memory bank 60 according to an example embodiment of the present disclosure may include a memory controller 20 and/or a bank array 30. In an embodiment, the memory controller 20 may include a control logic 21, a row driver 22, and/or a column driver 23. The bank array 30 may include a plurality of memory cells 40 and a plurality of redundancy memory cells.

In an embodiment, the row driver 22 may be connected to the memory cells 40 through the word line WL, while the column driver 23 may be connected to the memory cells 40 through the bit line BL. In an embodiment, the row driver 22 may include an address decoder for selecting a memory cell to which data is written and/or from which data is read, while the column driver 23 may include a sense amplifier and a column decoder for witting data to a memory cell, and/or for reading data from the memory cell. Operations of the row driver 22 and the column driver 23 may be controlled by the control logic 21. According to some example embodiments, operations described herein as being performed by the memory controller 20, the control logic 21, the row driver 22, the address decoder, the column driver 23, the sense amplifier and/or the column decoder may be performed by processing circuitry.

According to an embodiment of the present disclosure, at least a portion of memory cells 40 included in the bank array 30 may be a backup region. When the memory system 100 (e.g., the memory controller 200) writes data to a memory region determined to have the high probability of occurrence of an uncorrectable error, the memory system 100 (e.g., the memory controller 200) may simultaneously or contemporaneously write the data to the backup region. Thus, the memory system may have an effect of performing a failover function.

Figure 5:
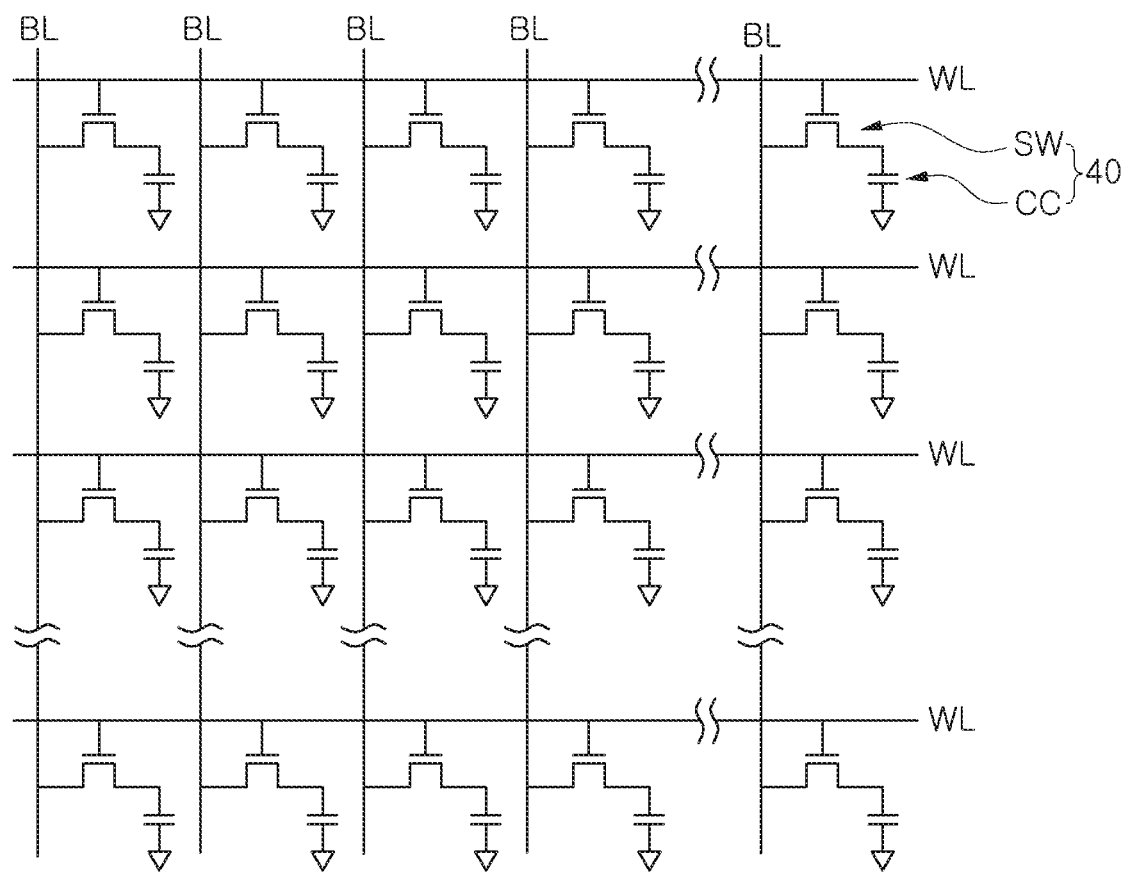
FIG. 5 is a view illustrating a bank array included in a memory device according to an example embodiment of the present disclosure.

FIG. 5 is a view illustrating a bank array included in a memory device according to an example embodiment of the present disclosure, Referring to FIG. 5, a bank array 30 according to an example embodiment of the present disclosure may include a plurality of memory cells 40. The memory cells 40 may be provided in points at which a plurality of word lines WL and a plurality of bit lines BL intersect. That is, each of the memory cells 40 may be connected to a single word line WL and a single bit line BL.

Each of the memory cells 40 may include a switch device SW and/or an information storage capacitor CC. In an embodiment, the switch device SW may include a transistor. A gate terminal of the transistor may be connected to a word line WL, and drain/source terminals of the transistor may be connected to a bit line BL and an information storage capacitor CC, respectively.

The memory controller may write or delete data by charging a charge in an information storage capacitor CC included in each of the plurality of memory cells 40, or discharging the charge, charged in the information storage capacitor CC, through a plurality of word lines WL and a plurality of bit lines BL. Moreover, the memory controller may read a voltage of the information storage capacitor CC, and thus read data from each of the plurality of memory cells 40. In an embodiment, the memory controller may perform a refresh operation to write data to the plurality of memory cells 40 again, to allow data not to be lost by naturally discharging the charge charged in the information storage capacitor CC.

Figure 6:
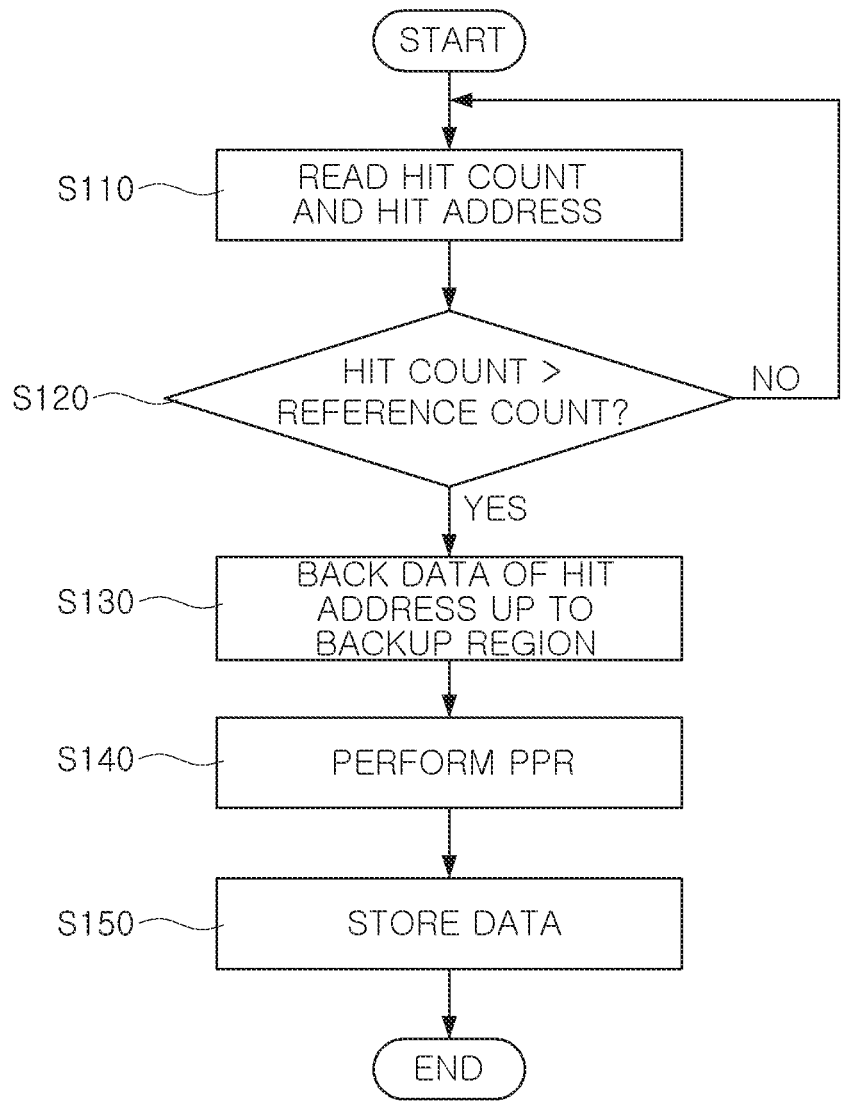
FIG. 6 is a flowchart illustrating an operation of a memory system storing data in a backup region BR based on a hit count according to an example embodiment of the present disclosure.
Figure 7A:
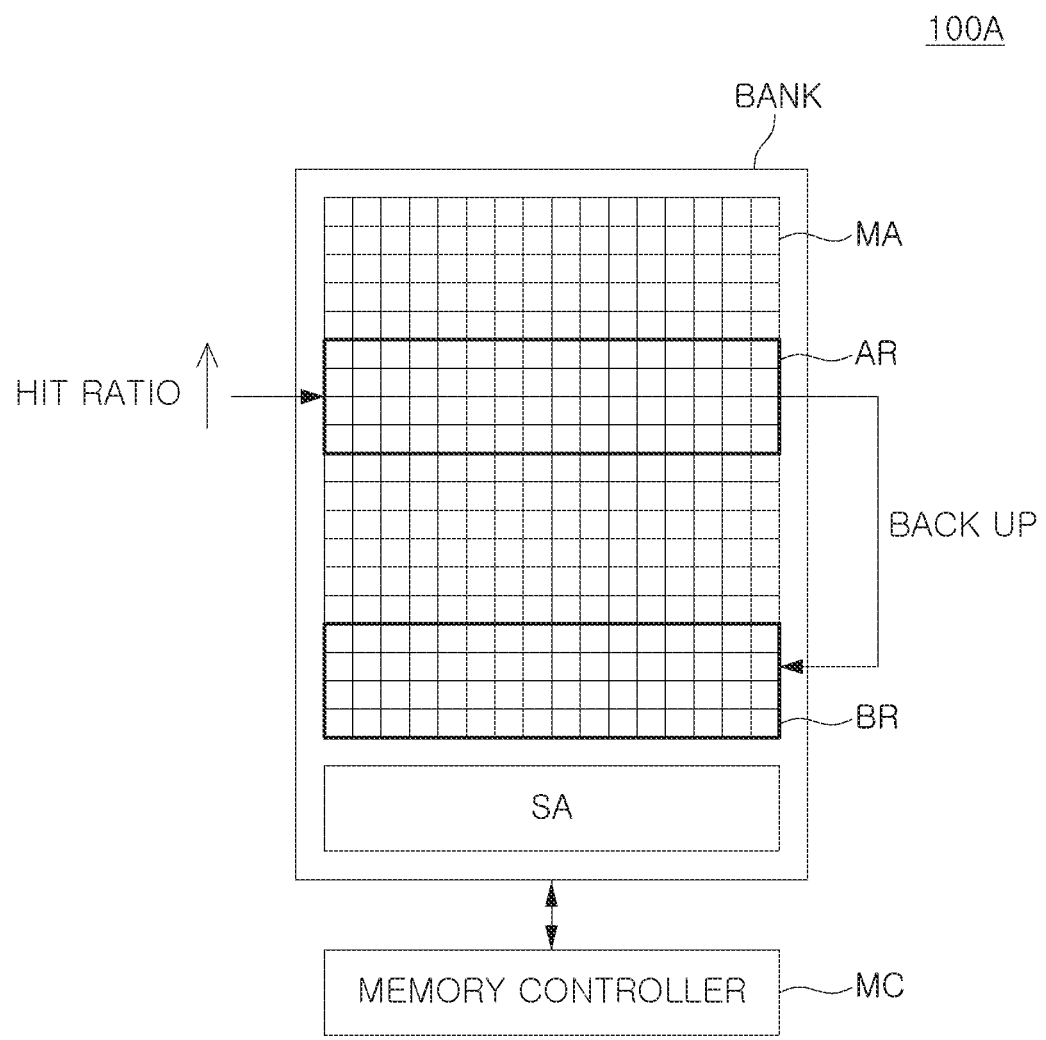
FIGS. 7A to 7C are schematic views illustrating a memory system performing the operation of FIG. 6 having an active region AR and a backup region BR in a single bank according to an example embodiment of the present disclosure.
Figure 7B:
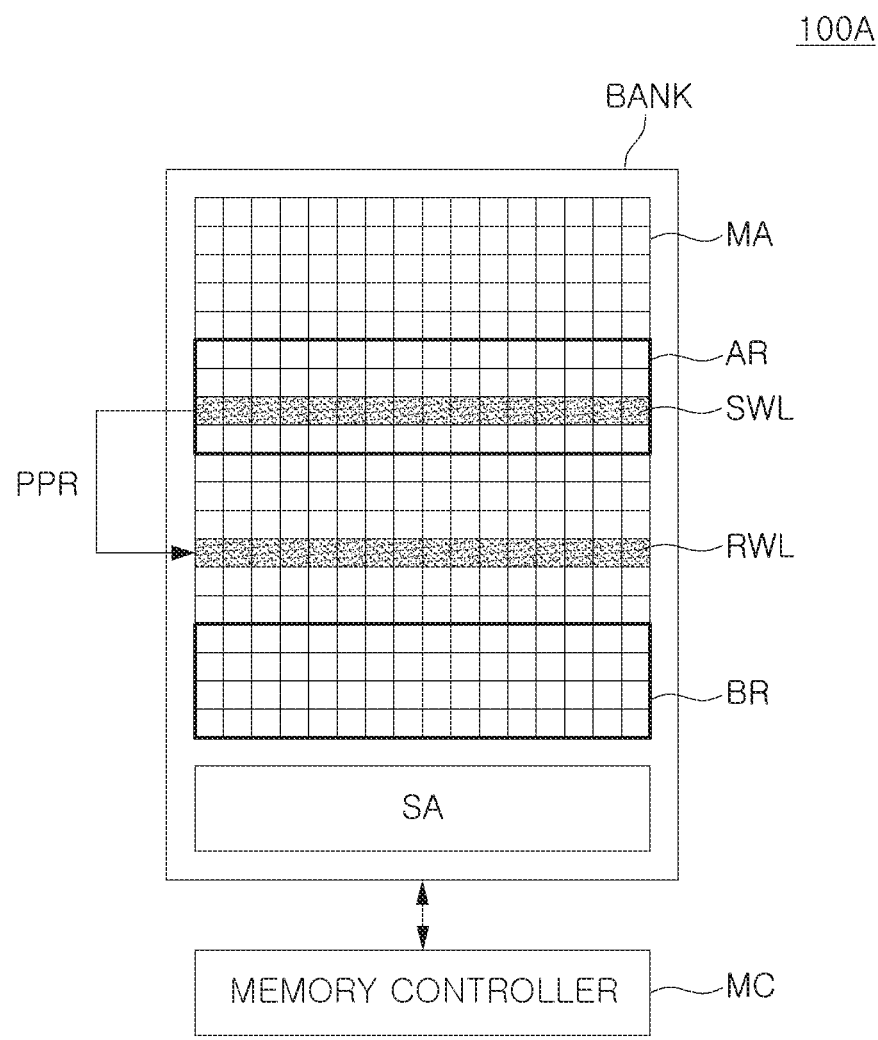
Figure 7C:
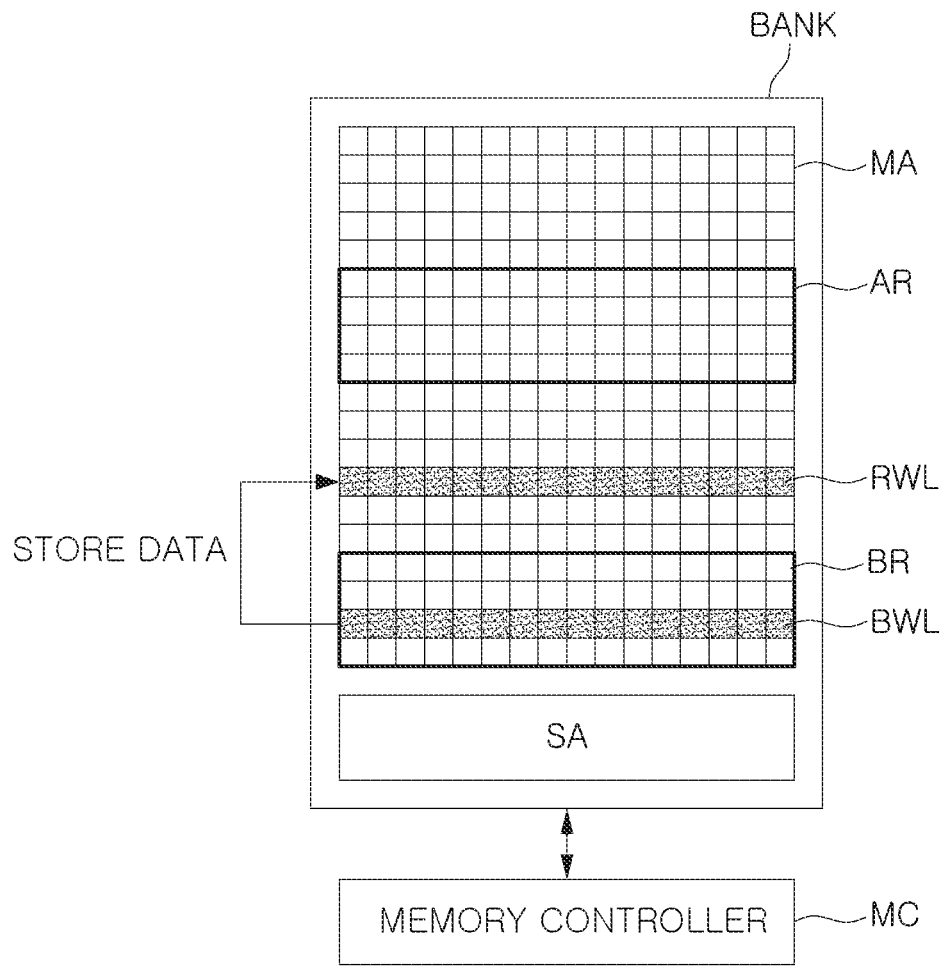

FIG. 6 is a flowchart illustrating an operation of a memory system according to an example embodiment of the present disclosure, while FIGS. 7A to 7C are schematic views illustrating a memory system according to an example embodiment of the present disclosure.

In FIGS. 7A to 7C, in the memory system 100A, a single bank BANK, among banks included in each of a plurality of memory devices, and a memory controller MC are illustrated.

A single bank BANK may include a plurality of memory cells MA, some of which may be considered redundancy memory cells. Moreover, the single bank BANK may include a backup region BR. According to some example embodiments, the memory system 100A may be the same as or similar to the memory system 100, and/or the memory controller MC may be the same as or similar to the memory controller 200.

Referring to FIGS. 6 and 7A, a memory controller MC may read periodically an address (hereinafter referred to as hit address) and an access count (hereinafter referred to as hit count), of a first region AR having the highest access count, of memory devices included in each of a plurality of memory devices (S110). For example, the memory controller MC may read a hit address and a hit count by mode register read (MRR). The mode register read (MRR) may refer to a user-readable mode register. According to some example embodiments, the first region AR may be a region including a defined quantity of contiguous memory cells (e.g., may include a defined number of contiguous word lines within the single bank BANK). According to some example embodiments, the first region AR may have the highest access count among regions within the single bank BANK, among regions within a single memory device among the plurality of memory devices, and/or among regions within a single memory module (e.g., the first memory module 110). According to some example embodiments, the hit count may be a count of accesses (e.g., write and/or read accesses) of a memory cell, word line and/or region.

The memory controller MC may count an access count of each of a plurality of memory devices. The memory controller MC may determine the most commonly accessed region of a plurality of memory devices as a first region AR according to a count result. The memory controller MC may store an address and an access count corresponding to the first region AR in a memory device (e.g., the SRAM 260) as a hit address and a hit count, respectively.

The memory controller MC may compare the hit count, corresponding to the first region AR, with a reference count (S120). As a result of comparison, if the hit count, corresponding to the first region AR, is greater than the reference count, the memory controller MC may memorize (e.g., store in a memory, such as the SRAM 260) the hit address, corresponding to the first region AR. According to some example embodiments, operation S120 may additionally or alternately include determining whether the hit count corresponding to the first region AR is greater than the reference count. According to some example embodiments, the reference count may be a design parameter determined through empirical study.

When the hit count, corresponding to the first region AR, is greater than the reference count, the possibility of wearing-out of the first region AR may be high. Thus, when data is stored in the first region AR, the probability of occurrence of the UECC may be high.

Thereafter, the memory controller MC may receive an address in which data is to be stored, together with a command to save the data, from a host. The address sent from the host may correspond to selected memory cells connected to a selected word line of the first region AR included in a selected memory device of a plurality of memory devices.

The memory controller MC may store data to be stored in selected memory cells (e.g., the selected memory cells corresponding to the address received from the host) in each of a selected word line and a backup region BR (e.g., in a word line BWL of the backup region BR) (S130). The hit count, corresponding to the first region AR, may be greater than the reference count. In this case, when data is stored in the first region AR, the data may be stored not only in selected memory cells connected to a selected word line but also in a backup region. Thus, the memory system 100A may write data in a region in which the UECC may occur, before the UECC has occurred, twice (e.g., once in the selected word line and once in the backup region BR). The memory system 100A may write data in advance to the backup region before the UECC has occurred, thereby performing a failover function.

When the hit count, corresponding to the first region AR, is less than a reference count, the memory controller MC may monitor continuously a hit address and a hit count, of the first region AR having the highest access count, of memory devices included in each of the plurality of memory devices (S110).

Referring to FIGS. 6 and 7B, the memory controller MC may replace a selected word line SWL, included in the first region AR, with a redundancy word line RWL, to which a plurality of redundancy memory cells are connected (S140). That is, a repair operation of replacing a selected word line SWL to which a defective memory cell is connected to with a redundancy word line RWL may be performed. The repair operation described above may be defined as a post package repair (PPR). For example, even when an address of the selected word line SWL is used after the memory controller MC performs the PPR, a redundancy word line may be accessed due to a decoding operation inside a DRAM. According to some example embodiments, replacing the selected word line SWL with the redundancy word line RWL, as described herein, may include correlating the redundancy word line RWL, instead of the selected word line SWL, to the address received from the host; and/or writing data to, and/or reading data from, the redundancy word line RWL when a corresponding command is received from the host in association with the address.

Referring to FIGS. 6 and 7C, the memory controller MC may store data stored in a memory cells connected to a word line BWL of a backup region BR to a plurality of redundancy memory cells connected to a redundancy word line RWL (S150). Thus, the memory system 100A (e.g., the memory controller MC) may read data from the redundancy word line RWL and/or may write data to the redundancy word line RWL, instead of the selected word line SWL included in the first region AR.

According to an embodiment of the present disclosure, a single bank BANK may include a backup region BR, and the memory controller MC may determine a memory region determined to have a high access count in the bank BANK. The memory controller MC may store data to be stored in the memory region determined to have a high access count in each of the memory region and the backup region BR. That is, with respect to a memory region having the high possibility of occurrence of the UECC, data to be stored in the memory region may be simultaneously or contemporaneously stored in a backup region. Before the UECC has occurred, data may be backed up in advance, a word line SWL to which a defective memory cell is connected may be replaced with a redundancy word line RWL through the PPR, and the backed up data may be stored in the redundancy word line RWL. The memory system 100A (e.g., the memory controller MC) may provide a service using a redundancy word line RWL instead of a word line SWL to which a defective memory cell is connected. Thus, the memory system 100A may perform a failover function.

Figure 8A:
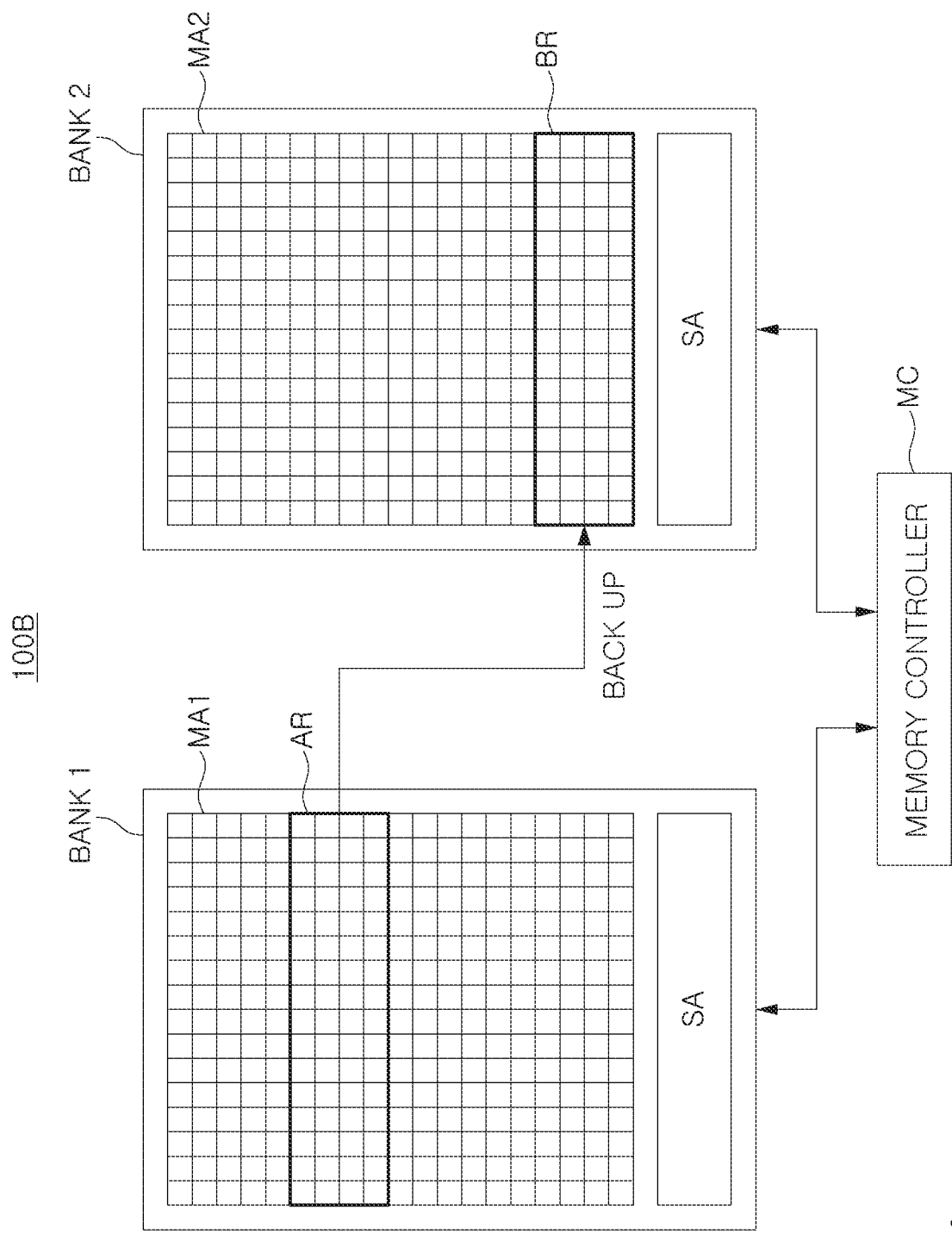
Figure 8C:
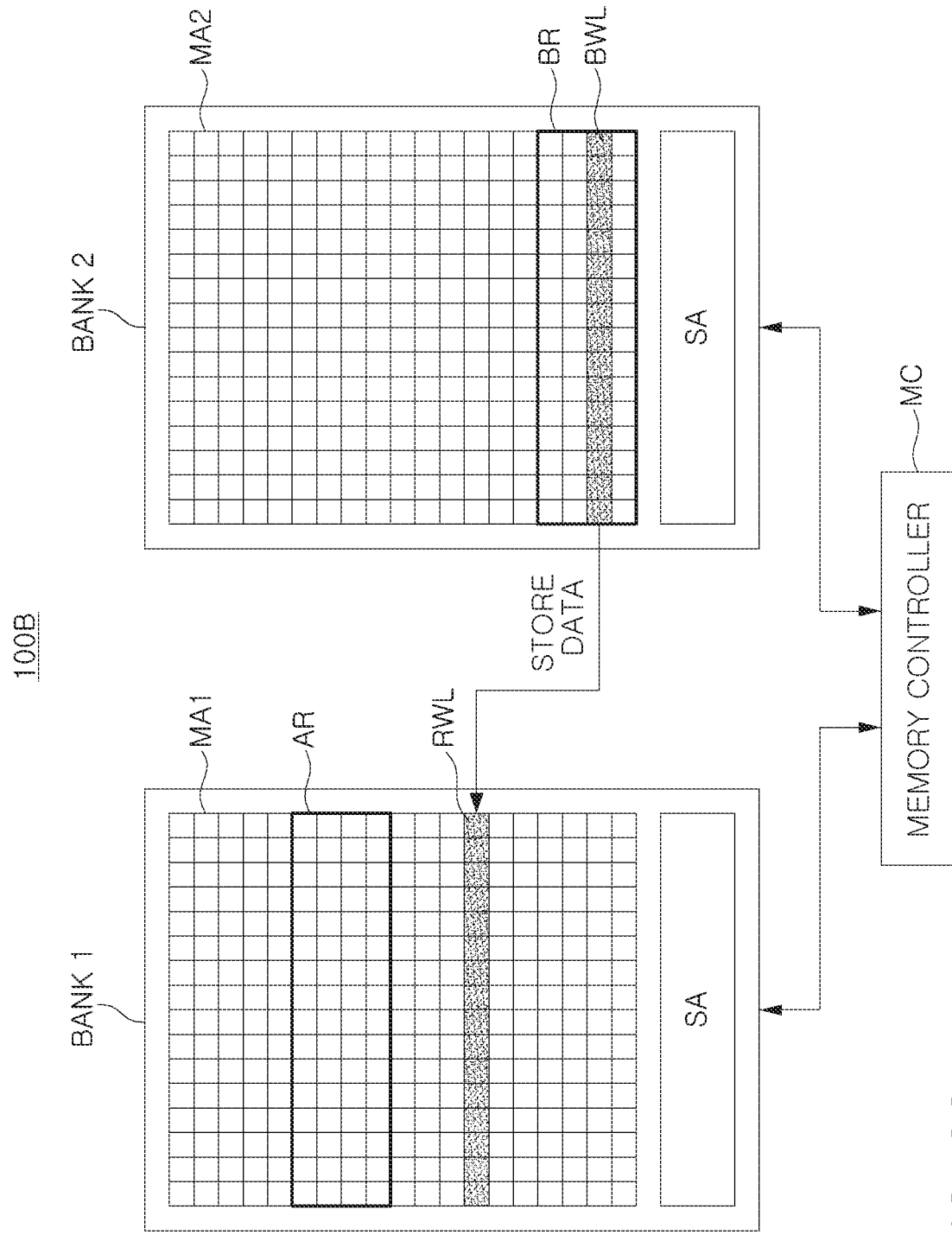

FIGS. 8A to 8C are schematic views illustrating a memory system according to an example embodiment of the present disclosure.

In a memory system 100B of FIGS. 8A to 8C, in a manner different from the memory system 100A of FIGS. 7A to 7C, a first region AR and a backup region BR may be included in different banks. For example, the first region AR may be included in the first bank BANK1, while the backup region BR may be included in the second bank BANK2. The first bank BANK1 may include a plurality of memory cells MA1, some of which may be considered redundancy memory cells MA1. The second bank BANK2 may include a plurality of memory cells MA2, some of which may be considered redundancy memory cells MA2. According to some example embodiments, the memory system 100B may be the same as or similar to the memory system 100, and/or the memory controller MC may be the same as or similar to the memory controller 200.

Referring to FIGS. 6 and 8A, a memory controller MC may read periodically a hit address and a hit count, of a first region AR having the highest access count, of memory devices included in each of a plurality of memory devices (S110). The first region AR may be included in the first bank BANK1. According to some example embodiments, the first region AR may be a region including a defined quantity of contiguous memory cells (e.g., may include a defined number of contiguous word lines within the first bank BANK1). According to some example embodiments, the first region AR may have the highest access count among regions within the single bank BANK, among regions within a single memory device among the plurality of memory devices, and/or among regions within a single memory module (e.g., the first memory module 110). According to some example embodiments, the hit count may be a count of accesses (e.g., write and/or read accesses) of a memory cell, word line and/or region.

The memory controller MC may compare the hit count, corresponding to the first region AR, with a reference count (S120). As a result of comparison, if the hit count, corresponding to the first region AR, is greater than the reference count, the memory controller MC may store the hit address, corresponding to the first region AR, in a memory device (e.g., the SRAM 260).

Thereafter, the memory controller MC may receive an address in which data is to be stored, together with a command to save the data, from a host. The address sent from the host may correspond to selected memory cells connected to a selected word line of the first region AR included in a selected memory device of a plurality of memory devices.

The memory controller MC may store data to be stored in selected memory cells in each of a selected word line and a backup region BR (S130). The backup region BR may be included in the second bank BANK2. Thus, the backup region BR and the first region AR may be included in different banks.

Referring to FIGS. 6 and 8B, the memory controller MC may replace (e.g., via PPR) a selected word line SWL, included in the first region AR, with a redundancy word line RWL, to which a plurality of redundancy memory cells are connected (S140). The plurality of redundancy memory cells may be included in the first bank BANK1. Thus, the redundancy word line RWL and the first region AR may be included in the same bank or similar banks.

Referring to FIGS. 6 and 8C, the memory controller MC may store data stored in the backup region BR of the second bank BANK2 to a redundancy word line RWL of the first bank BANK1 (S150). Thus, the memory system 100B (e.g., the memory controller MC) may read data from the redundancy word line RWL and/or may write data to the redundancy word line RWL, instead of the selected word line SWL included in the first region AR.

According to an embodiment of the present disclosure, the second bank BANK2 may include a backup region BR, and the memory controller may determine a memory region AR determined to have a high access count in the first bank BANK1. The memory controller MC may store data to be stored in a memory region AR determined to have a high access count in each of the memory region AR and the backup region BR. That is, with respect to a memory region AR having the high possibility of occurrence of the UECC, data to be stored in the memory region AR may be simultaneously or contemporaneously stored in the backup region BR. The memory system 100B (e.g., the memory controller MC) may back data up in advance, before the UECC has occurred, replace a word line SWL to which a defective memory cell is connected with a redundancy word line RWL through the PPR, and store the backed up data in the redundancy word line RWL. The memory system 100B may provide a service using a redundancy word line RWL instead of a word line SWL to which a defective memory cell is connected. Thus, the memory system 100B may perform a failover function.

Figure 9:
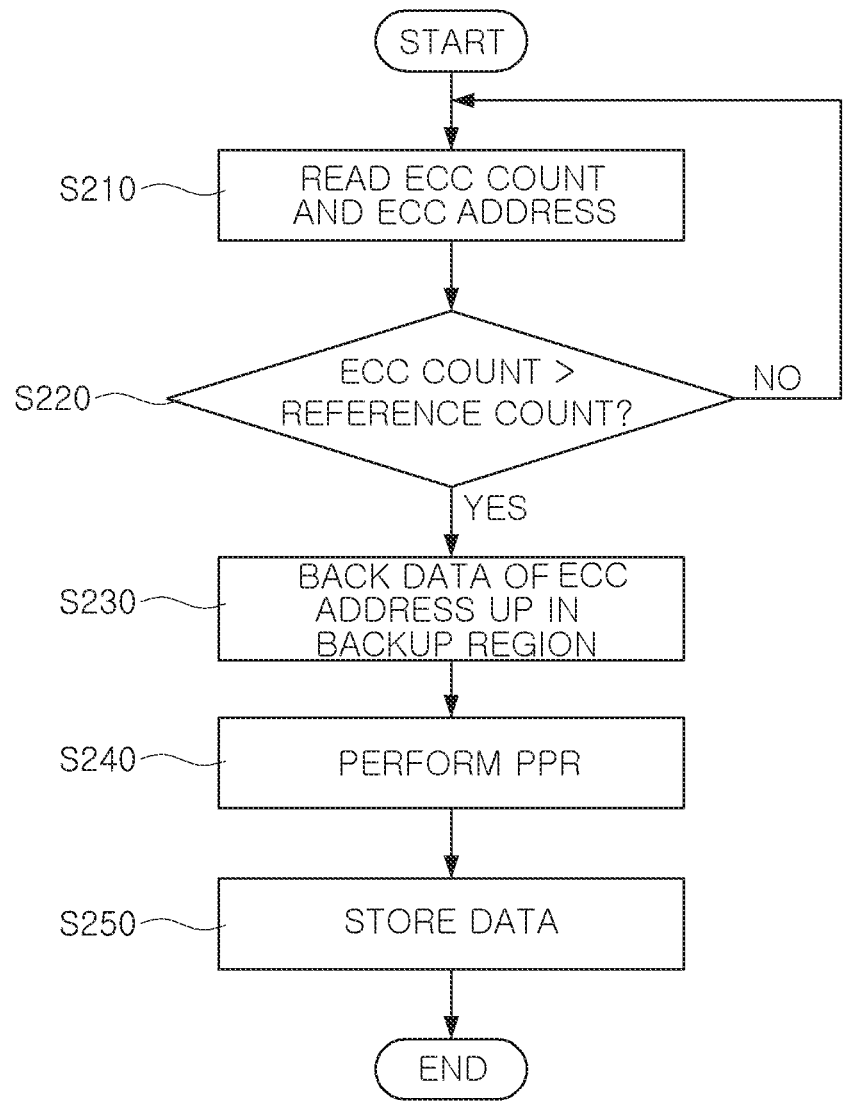
FIG. 9 is a flowchart illustrating an operation of a memory system storing data in a backup region BR based on a CECC occurrence count according to an example embodiment of the present disclosure.
Figure 10A:
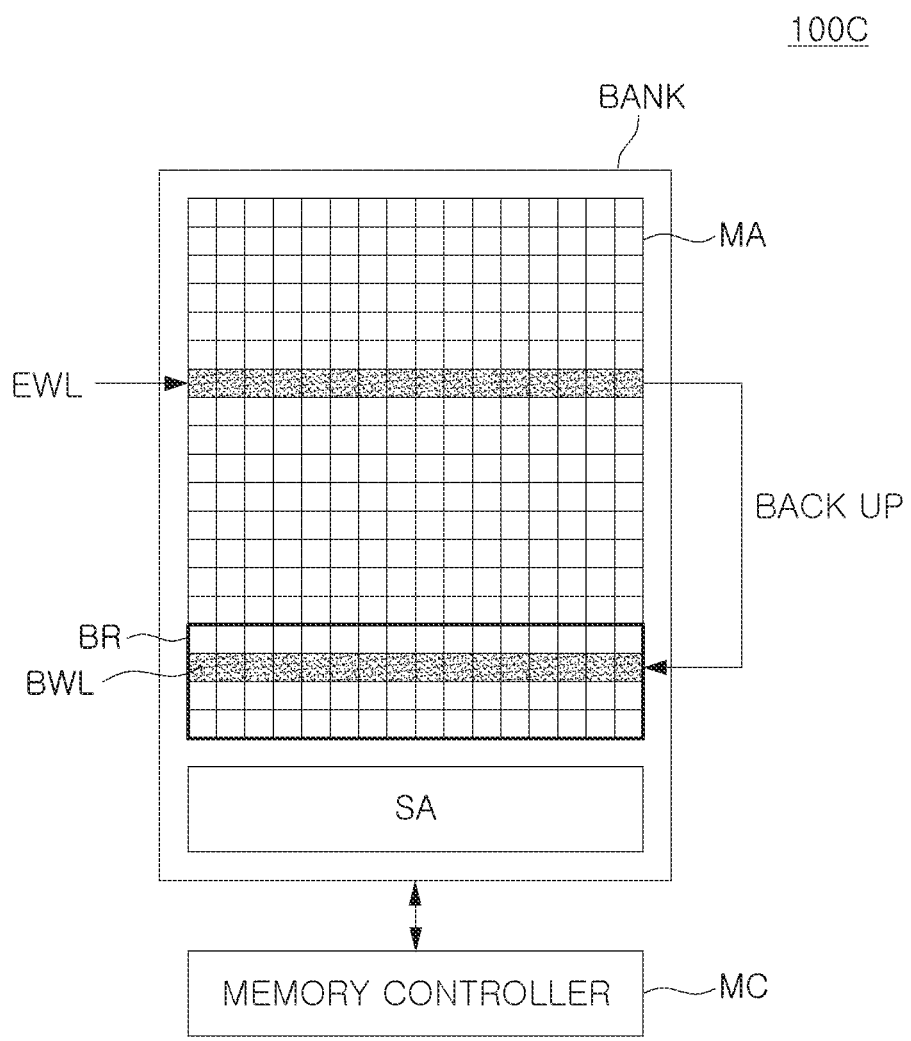
FIGS. 10A to 10C are schematic views illustrating a memory system performing the operation of FIG. 9 having word line EWL to which a defective memory cell is connected and a backup region BR in a single bank according to an example embodiment of the present disclosure.
Figure 10B:
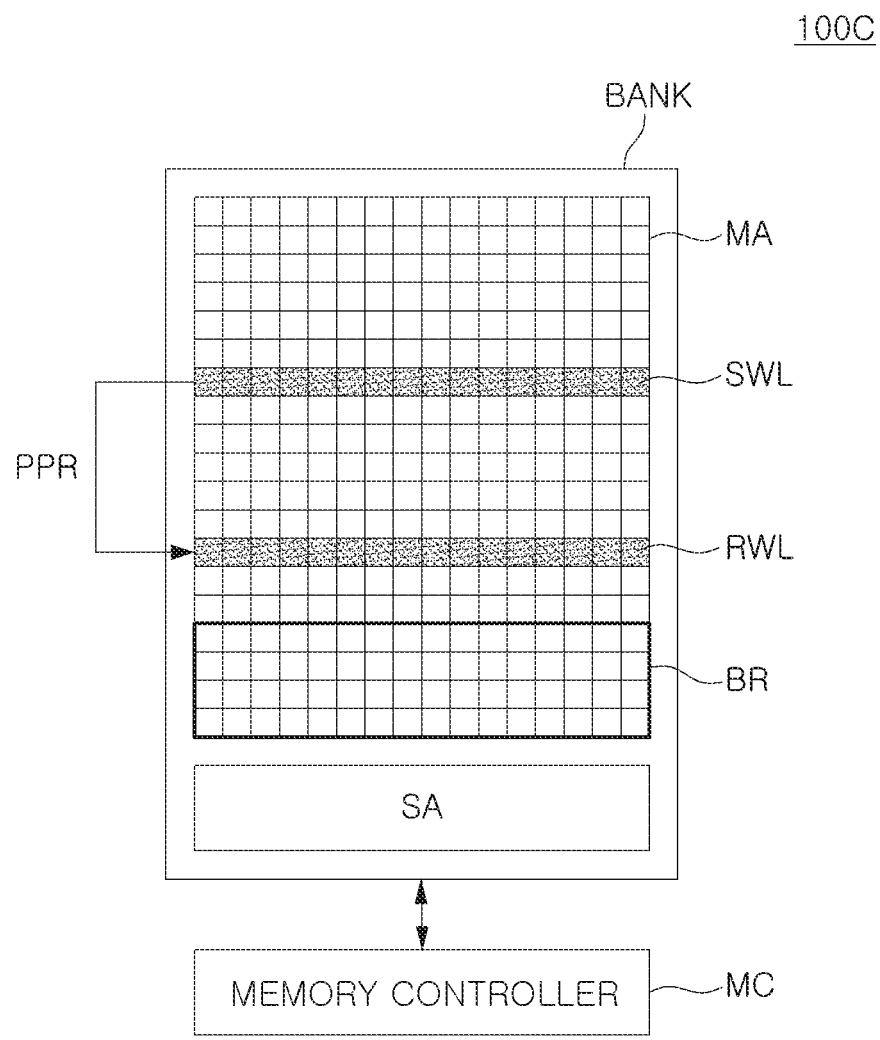
Figure 10C:
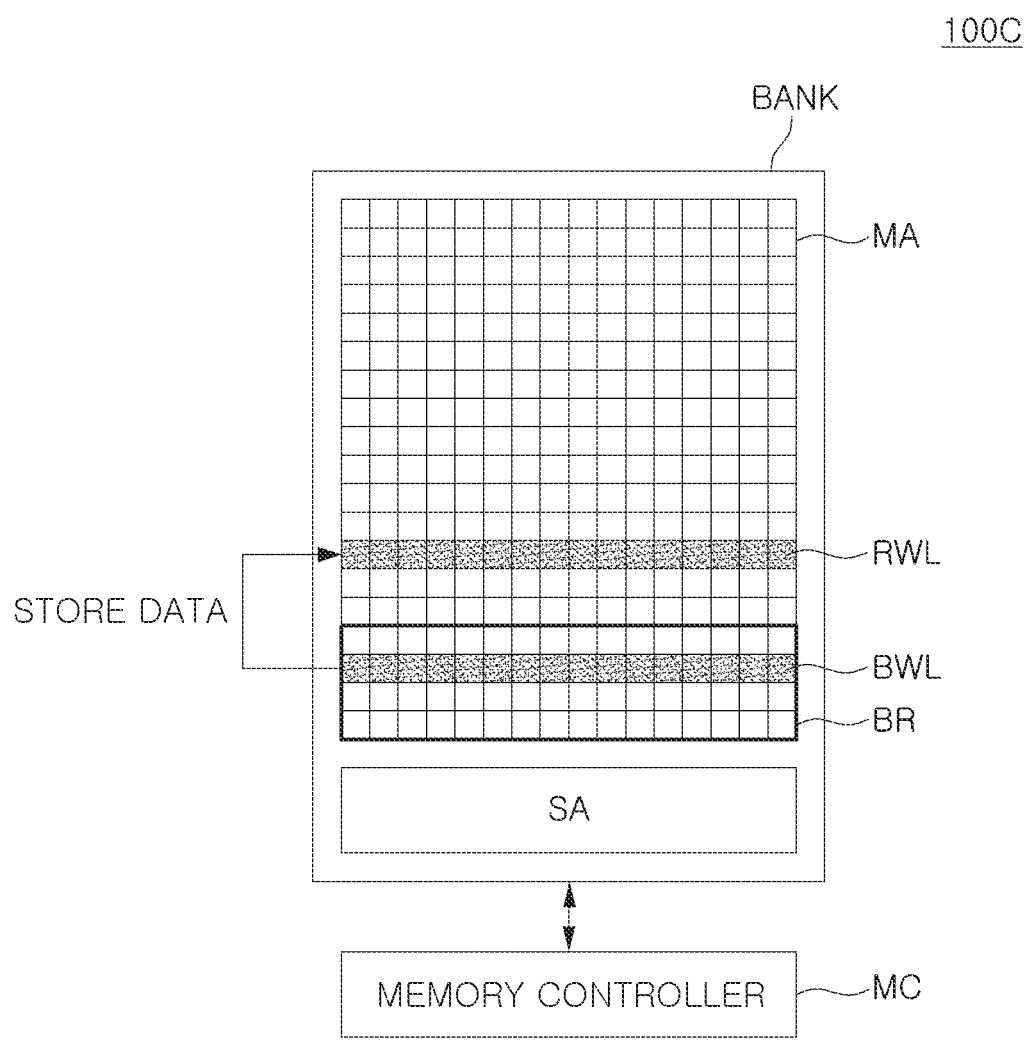

FIG. 9 is a flowchart illustrating an operation of a memory system according to an example embodiment of the present disclosure, while FIGS. 10A to 10C are schematic views illustrating a memory system according to an example embodiment of the present disclosure.

In FIGS. 10A to 10C, in the memory system 100C, a single bank BANK, among banks included in each of a plurality of memory devices, and a memory controller MC are illustrated. A single bank BANK may include a plurality of memory cells MA, some of which may be considered redundancy memory cells. Moreover, the single bank BANK may include a backup region BR. According to some example embodiments, the memory system 100C may be the same as or similar to the memory system 100, and/or the memory controller MC may be the same as or similar to the memory controller 200.

Referring to FIGS. 9 and 10A, a memory controller MC may read periodically an address (hereinafter referred to as an ECC address) and an ECC count, of memory cells having the highest occurrence count of the CECC, of memory devices included in each of the plurality of memory devices (S210). For example, the memory controller MC may store an ECC address and an ECC count, of memory cells having the highest occurrence count of the CECC, in the memory controller MC (e.g., in the SRAM 260) in advance.

The memory controller MC may confirm (e.g., determine) a location of a word line including a defective memory cell having the highest occurrence count of the CECC, of a plurality of memory cells of a memory region by referring to the ECC address. For example, the ECC address may include a bank address, a row address, and/or a column address. Thus, the memory controller MC may confirm the address, that is, the ECC address of a word line EWL to which a defective memory cell is connected.

The memory controller MC may count a CECC occurrence count of a plurality of memory devices. The memory controller MC may determine a defective memory cell in which the CECC has most frequently occurred, among a plurality of memory devices, according to a count result. The memory controller MC may store an ECC address and an ECC count, corresponding to a word line EWL to which a defective memory cell is connected, in the memory controller MC (e.g., in the SRAM 260). According to some example embodiments, the memory controller MC may determine a defective memory cell in which the CECC has most frequently occurred among memory cells within a word line, among memory cells within a bank, among memory cells within a single memory device, and/or among memory cells within a single memory module (e.g., the first memory module 110).

The memory controller MC may compare the ECC count, corresponding to the word line EWL, with a reference count (S220). As a result of comparison, if the ECC count, corresponding to the word line EWL, is greater than the reference count, the memory controller MC may memorize the ECC address, corresponding to the word line EWL (the word line EWL may also be referred to as a "region" herein). The ECC count, corresponding to the word line EWL, may be greater than the reference count. In this case, when data is stored to the word line EWL, probability of occurrence of the UECC may be high. According to some example embodiments, operation S220 may additionally or alternately include determining whether the ECC count corresponding to the word line EWL is greater than the reference count. According to some example embodiments, the reference count may be a design parameter determined through empirical study.

Thereafter, the memory controller MC may receive an address in which data is to be stored, together with a command to save the data, from a host. The address sent from the host may correspond to selected memory cells connected to a selected word line SWL corresponding to (e.g., being the same word line as or a similar word line to) the word line EWL of a selected memory device of a plurality of memory devices.

The memory controller MC may store data to be stored in selected memory cells (e.g., the selected memory cells corresponding to the address received from the host) in each of a selected word line SWL and a backup region BR (e.g., in a word line BWL of the backup region BR) (S230). That is, the ECC count, corresponding to the selected word line SWL, may be greater than the reference count. In this case, when data is stored in the selected word line SWL, the data may be simultaneously or contemporaneously stored not only in the selected word line SWL but also in the backup region BR. Thus, data may be backed up in the case the UECC has occurred.

When the ECC count, corresponding to the word line SWL, is less than the reference count, the memory controller MC may monitor continuously an ECC address and an ECC count, of memory cells having the highest occurrence count of the CECC, of memory devices included in each of the plurality of memory devices (S210).

Referring to FIGS. 9 and 10B, the memory controller MC may replace (e.g., perform PPR) a selected word line SWL with a redundancy word line RWL, to which a plurality of redundancy memory cells are connected (S240). That is, a repair operation of replacing a selected word line SWL to which a defective memory cell is connected to with a redundancy word line RWL may be performed (e.g., replacing the selected word line SWL with the redundancy word line RWL as the word line to which the address received from the host refers).

Referring to FIGS. 9 and 10C, the memory controller MC may store data stored in the backup region BR to a redundancy word line RWL (S250). Thus, the memory system 100C (e.g., the memory controller MC) may read data from the redundancy word line RWL and/or may write data to the redundancy word line RWL, instead of the selected word line SWL corresponding to the word line EWL.

According to an embodiment of the present disclosure, a single bank BANK may include a backup region BR, and the memory controller MC may determine a word line EWL, to which a defective memory cell determined to have a high count of occurrence of the CECC is connected, in the bank BANK. The memory controller MC may store data to be written to the word line EWL to which a defective memory cell is connected in each of the word line EWL (e.g., the selected word line SWL) and the backup region BR. That is, with respect to memory cells having the high possibility of occurrence of the UECC, data to be stored in the memory cells may be simultaneously or contemporaneously stored in the backup region BR. Before the UECC has occurred, the data may be backed up in advance, so the memory system 100C may perform a failover function.

Figure 11A:
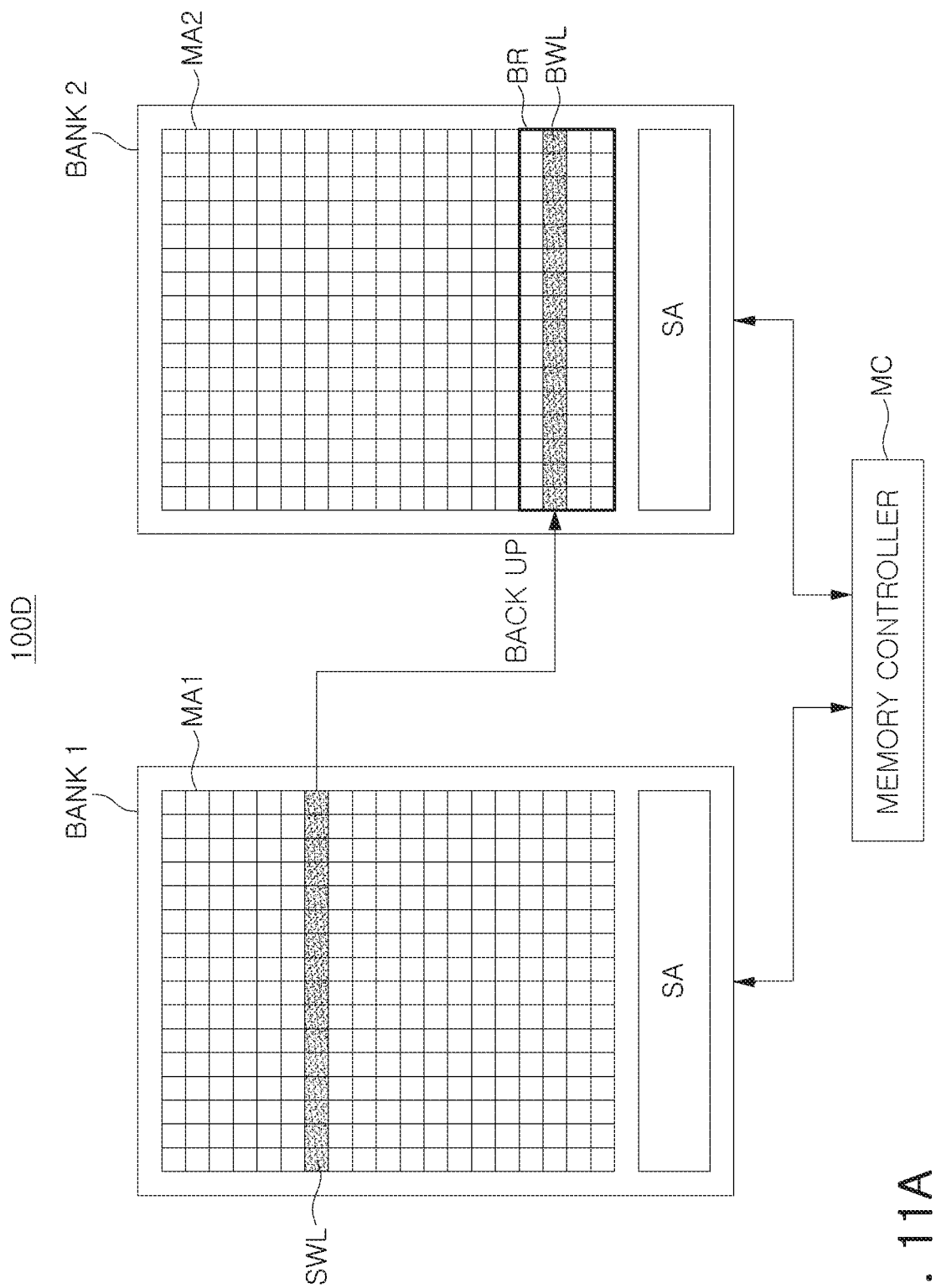
FIGS. 11A to 11C are schematic views illustrating a memory system performing the operation of FIG. 9 having word line EWL to which a defective memory cell is connected and a backup region BR in different banks according to an example embodiment of the present disclosure.
Figure 11B:
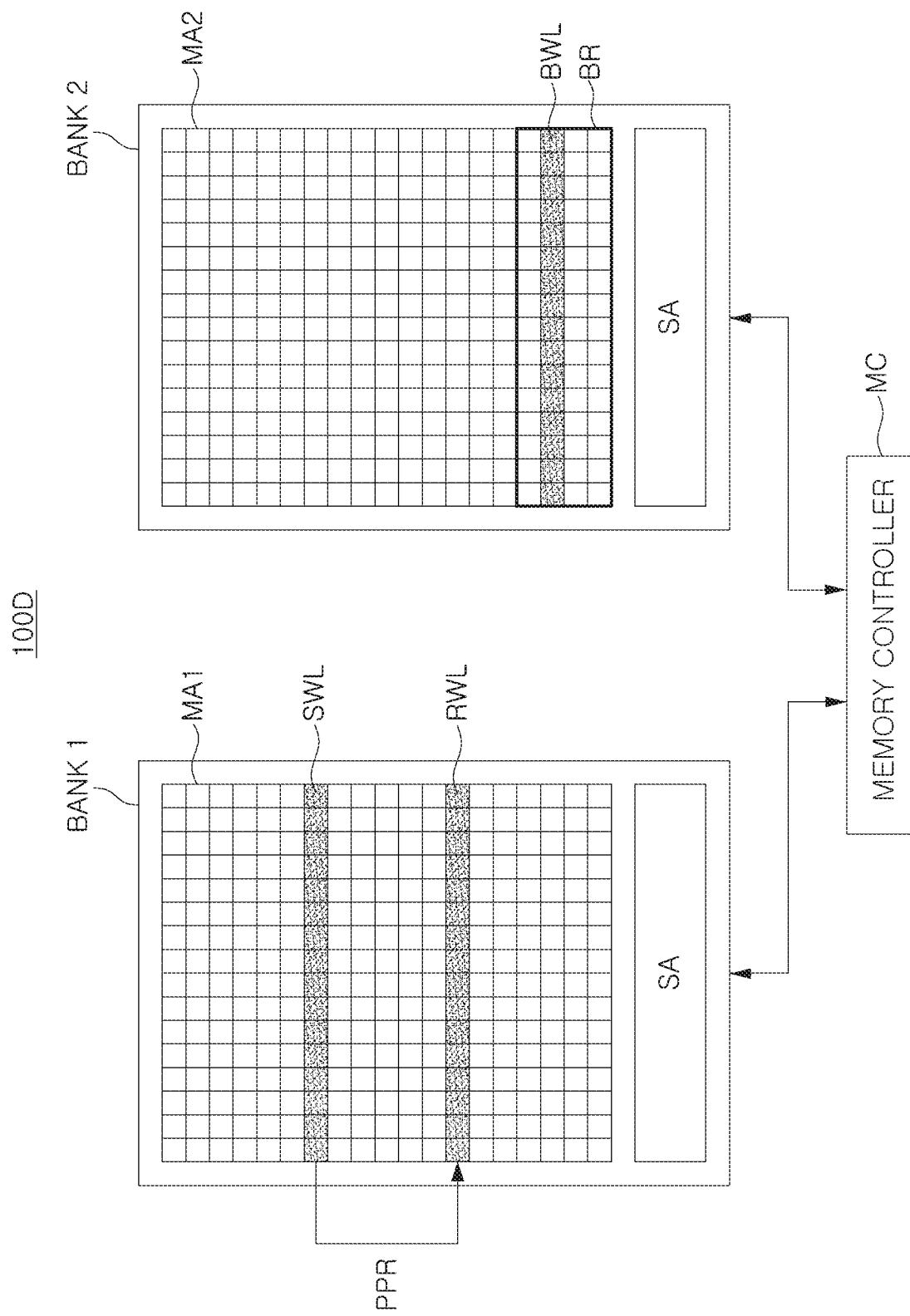
Figure 11C:
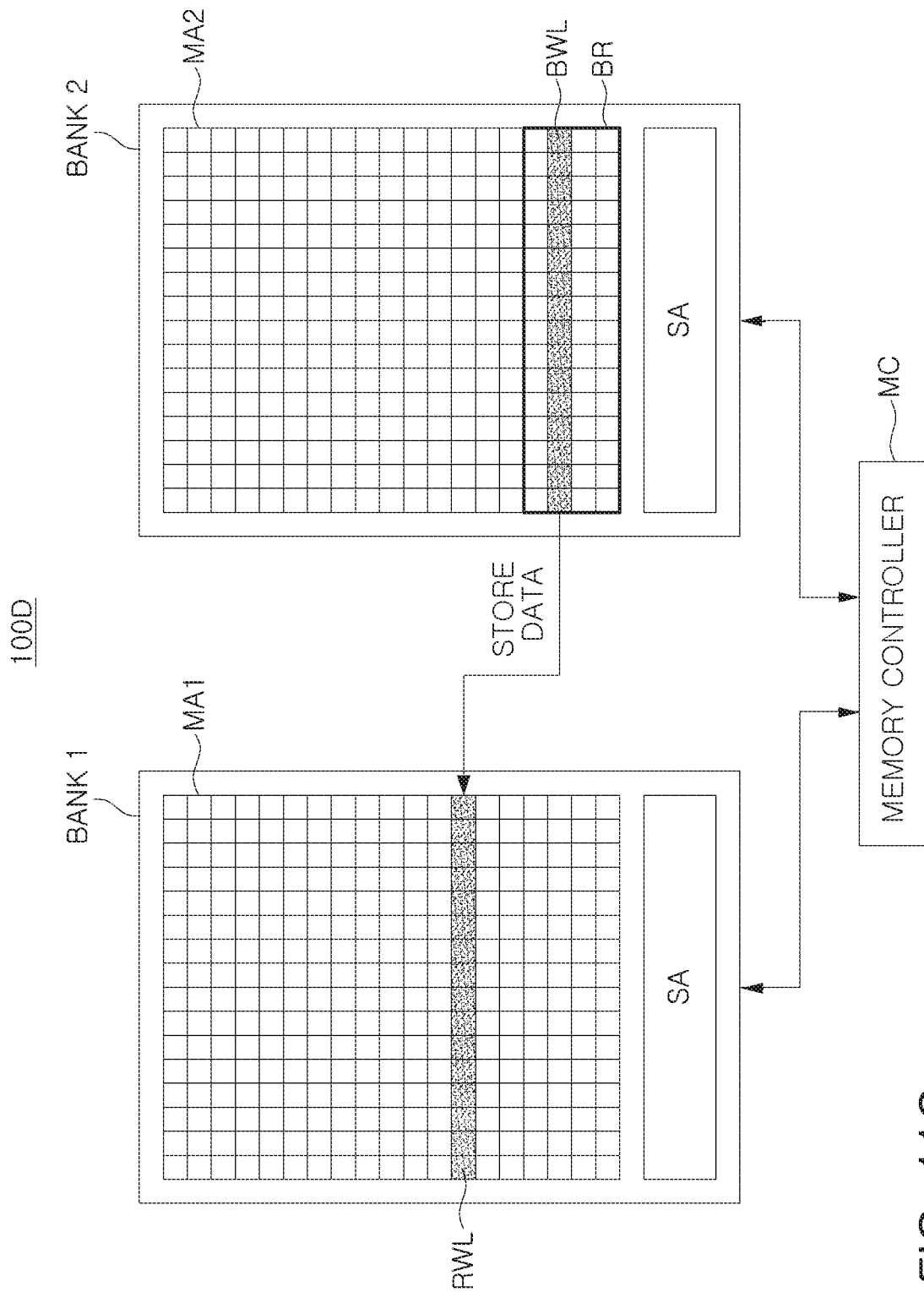

FIGS. 11A to 11C are schematic views illustrating a memory system according to an example embodiment of the present disclosure.

Regarding a structure of the memory system 100D of FIGS. 11A to 11C, in a manner different from the memory system 100C of FIGS. 10A to 10C, a word line EWL to which a defective memory cell is connected and a backup region BR may be included in different banks. For example, the word line EWL connected to the defective memory cell may be included in the first bank BANK1, while the backup region BR may be included in the second bank BANK2. The first bank BANK1 may include a plurality of memory cells MA1, some of which may be considered redundancy memory cells. The second bank BANK2 may include a plurality of memory cells MA2, some of which may be considered redundancy memory cells. According to some example embodiments, the memory system 100D may be the same as or similar to the memory system 100, and/or the memory controller MC may be the same as or similar to the memory controller 200.

Referring to FIGS. 9 and 11A, a memory controller MC may periodically read an ECC address and an ECC count, of a word line EWL to which memory cells having the highest occurrence count of the CECC, of memory devices included in each of the plurality of memory devices, are connected (S210). The word line EWL to which the memory cell having the highest occurrence count of the CECC is connected may be included in the first bank BANK1.

The memory controller MC may compare the ECC count, corresponding to the word line EWL, with a reference count (S220). As a result of comparison, if the ECC count, corresponding to the word line EWL, is greater than the reference count, the memory controller MC may memorize (e.g., store in a memory, such as the SRAM 260) the ECC address, corresponding to the word line EWL. According to some example embodiments, the memory controller MC may determine a defective memory cell in which the CECC has most frequently occurred among memory cells within a word line, among memory cells within a bank, among memory cells within a single memory device, and/or among memory cells within a single memory module (e.g., the first memory module 110).

Thereafter, the memory controller MC may receive an address in which data is to be stored, together with a command to save the data, from a host. The address sent from the host may correspond to selected memory cells connected to a selected word line SWL corresponding to (e.g., being the same word line as or a similar word line to) the word line EWL of a selected memory device of a plurality of memory devices.

The memory controller MC may store data to be stored in selected memory cells (e.g., the selected memory cells corresponding to the address received from the host) in each of a selected word line SWL and a backup region BR (e.g., in a word line BWL of the backup region BR (S230). The backup region BR may be included in a second bank BANK2 different from the first bank BANK1 in which the selected word line SWL is included.

Referring to FIGS. 9 and 11B, the memory controller MC may replace a selected word line SWL with a redundancy word line RWL, to which a plurality of redundancy memory cells are connected (S240). The redundancy word line RWL may be included in the first bank BANK1. Thus, the redundancy word line RWL and the backup region BR may be included in different banks.

Referring to FIGS. 9 and 11C, the memory controller MC may store data stored in the backup region BR of the second bank BANK2 to a redundancy word line RWL of the first bank BANK1 (S250). Thus, the memory system 100D (e.g., the memory controller MC) may read data from the redundancy word line RWL and/or may write data to the redundancy word line RWL, instead of the selected word line SWL.

According to an embodiment of the present disclosure, the second bank BANK2 may include the backup region BR, and the memory controller MC may determine a defective memory cell determined to have a high count of occurrence of the CECC in the first bank BANK1. The bank including the defective memory cell may be different from the bank including the backup region. The memory controller MC may store data to be stored in a word line SWL, to which a defective memory cell determined to have a high count of occurrence of the CECC is connected, in each of the word line SWL and the backup region BR. That is, with respect to a memory region having the high possibility of occurrence of the UECC, data to be stored in the word line SWL may be simultaneously or contemporaneously stored in the backup region BR. The memory system 100D (e.g., the memory controller MC) may back data up in advance, before the UECC has occurred, replace a word line SWL to which a defective memory cell is connected with a redundancy word line RWL through the PPR, and store the backed up data in the redundancy word line RWL. The memory system 100D (e.g., the memory controller MC) may provide a service using a redundancy word line RWL instead of a word line SWL to which a defective memory cell is connected. Thus, the memory system 100D (e.g., the memory controller MC) may perform a failover function.

Figure 12:
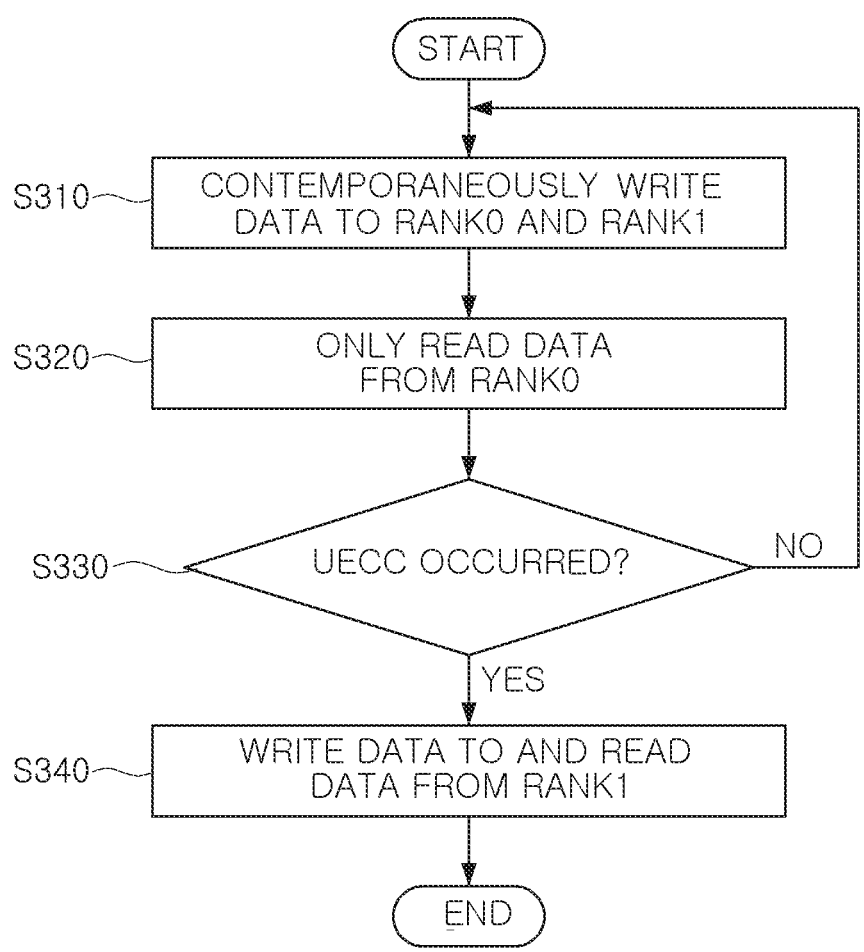
FIG. 12 is a flowchart illustrating an operation of a memory system having different ranks of memory devices according to an example embodiment of the present disclosure.
Figure 13A:
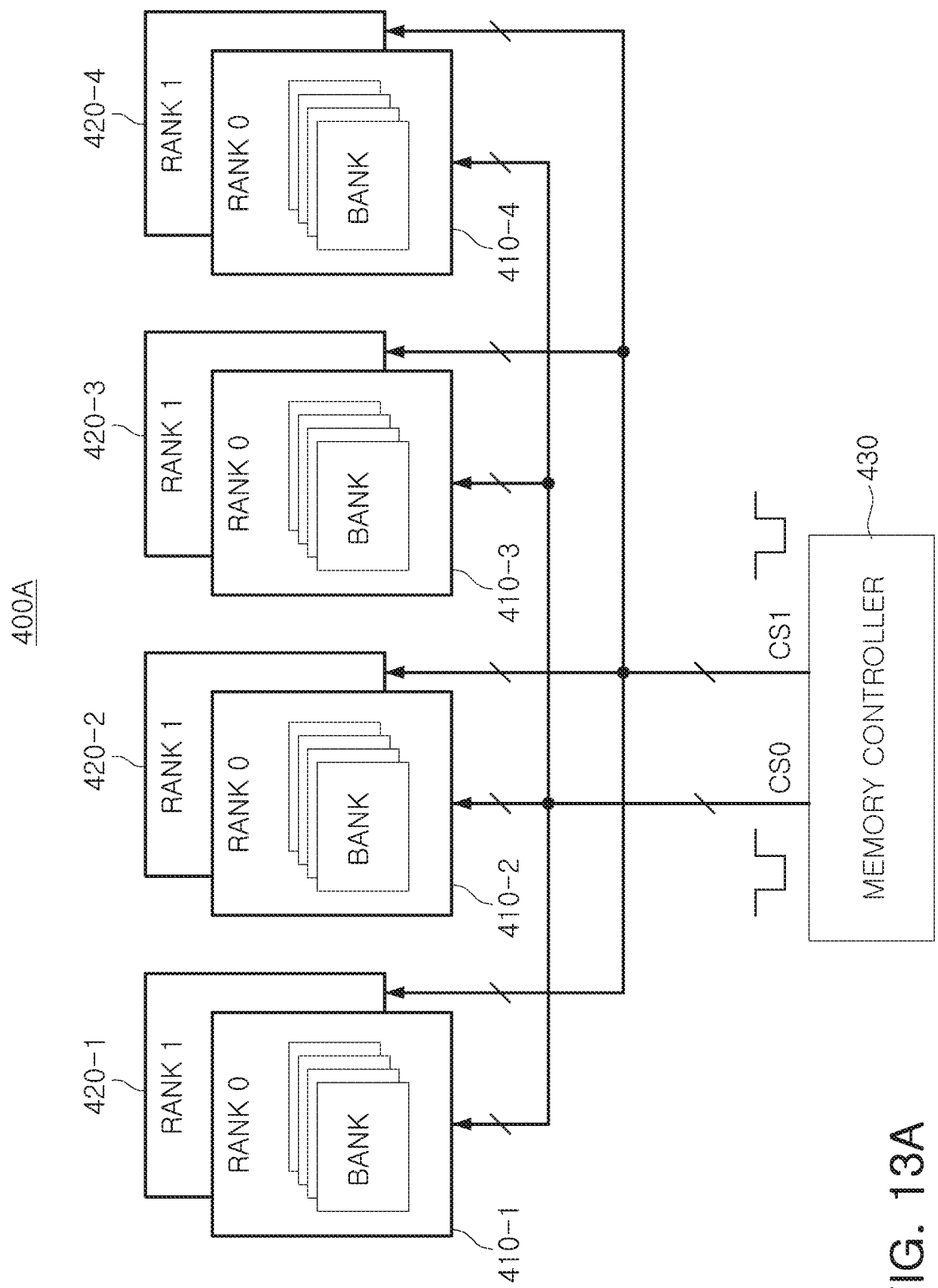
FIGS. 13A to 13C are schematic views illustrating a memory system performing the operation of FIG. 12 according to an example embodiment of the present disclosure.
Figure 13B:
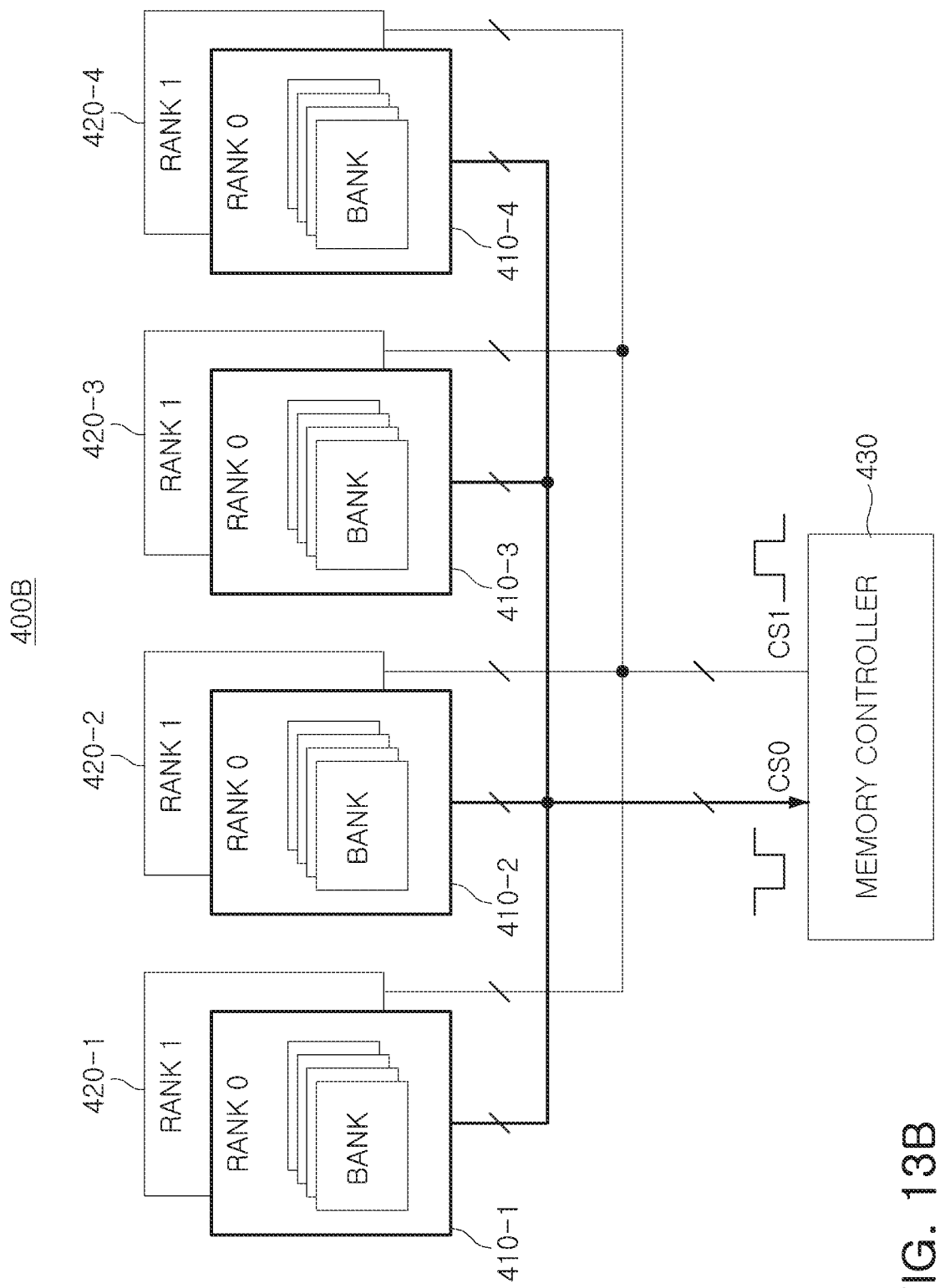
Figure 13C:
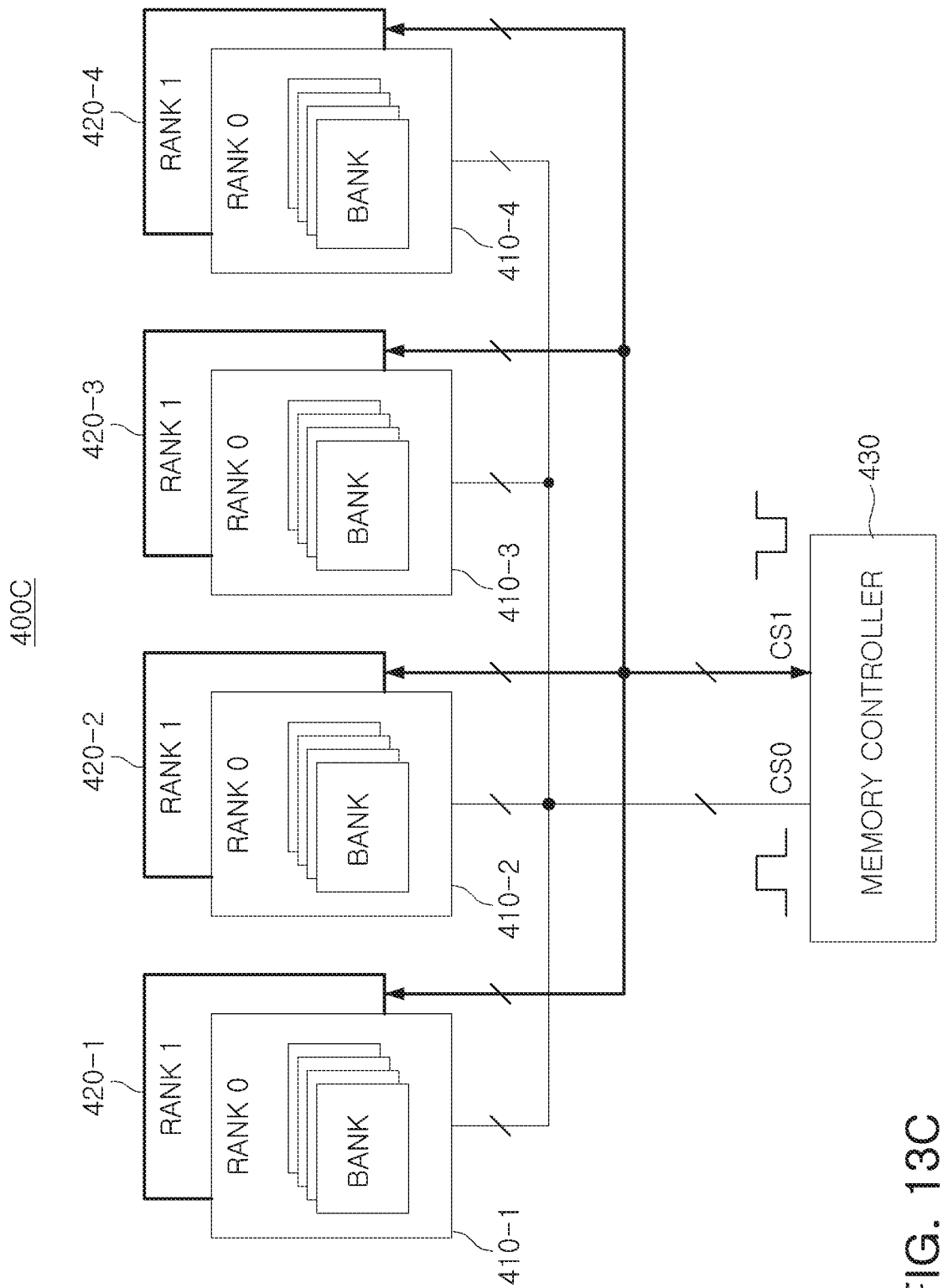

FIG. 12 is a flowchart illustrating an operation of a memory system according to an example embodiment of the present disclosure, while FIGS. 13A to 13C are schematic views illustrating a memory system according to an example embodiment of the present disclosure.

In FIGS. 13A to 13C, memory systems 400A, 400B, and 400C may include memory devices 410-1 to 410-4 (e.g., the memory device 410-1, the memory device 410-2, the memory device 410-3, and the memory device 410-4) and 420-1 to 420-4 (e.g., the memory device 420-1, the memory device 420-2, the memory device 420-3, and the memory device 420-4), configured as a multi-rank, and/or a memory controller 430. According to some example embodiments, the memory system 400A, the memory system 400B and/or the memory system 400C may be the same as or similar to the memory system 400. According to some example embodiments, the memory controller 430 may be the same as or similar to the memory controller 130 and/or the memory controller 200. According to some example embodiments, the memory devices 410-1 to 410-4 and/or the memory devices 420-1 to 420-4 may be the same as or similar to the memory devices 110-1 to 110-4 and/or the memory devices 120-1 to 120-4.

The memory devices 410-1 to 410-4 and 420-1 to 420-4 may be referred to as first memory devices 410-1 to 410-4, classified as first rank RANK0, and second memory devices 420-1 to 420-4, classified as second rank RANK1. Each of the memory devices 410-1 to 410-4 and 420-1 to 420-4 may include at least one memory bank.

According to an embodiment, at least one of the first memory devices 410-1 to 410-4 and at least one of the second memory devices 420-1 to 420-4 may be included in a single memory package. For example, a first memory device 410-1 of the first memory devices 410-1 to 410-4 and a second memory device 420-1 of the second memory devices 420-1 to 420-4 may be included in a first memory package.

By the same principle, the first memory device 410-2 and the second memory device 420-2 may be included in a second memory package, the first memory device 410-3 and the second memory device 420-3 may be included in a third memory package, and the first memory device 410-4 and the second memory device 420-4 may be included in a fourth memory package.

The memory controller 430 may output a first chip select signal CS0 and a second chip select signal CS1. The memory controller 430 may activate a first chip select signal CS0 to select the first memory devices 410-1 to 410-4. The memory controller 430 may activate a second chip select signal CS1 to select the second memory devices 420-1 to 420-4.

According to an example embodiment of the present disclosure, in the memory systems 400A, 400B, and 400C, memory devices 410-1 to 410-4 and 420-1 to 420-4 may have more than two times the capacity desired for use by a memory module (for example, DRAM) in performing data storage under the instructions of a host, and may be configured as a multi-rank. For example, the capacity desired for use by the memory devices 410-1 to 410-4 and 420-1 to 420-4 may be 8 Gbit. In this case, according to the related art, the first memory devices 410-1 to 410-4, classified as the first rank RANK0, were configured as 4 Gbit, while the second memory devices 420-1 to 420-4, classified as the second rank RANK1, were configured as 4 Gbit.

However, according to an example embodiment, the capacity desired for use by the memory devices 410-1 to 410-4 and 420-1 to 420-4 may be 8 Gbit. In this case, the first memory devices 410-1 to 410-4, classified as the first rank RANK0, may be configured as 8 Gbit, while the second memory devices 420-1 to 420-4, classified as the second rank RANK1, may be configured as 8 Gbit.

Thus, among the first memory devices 410-1 to 410-4, classified as the first rank RANK0, and the second memory devices 420-1 to 420-4, classified as the second rank RANK1, the second memory devices 420-1 to 420-4, classified as the second rank RANK1, may be used as a backup region.

The memory controller 130 may activate a first chip select signal CS0 to select the first memory devices 410-1 to 410-4. Simultaneously or contemporaneously, the memory controller 430 may activate a second chip select signal CS1 to select the second memory devices 420-1 to 420-4. According to some example embodiments, the memory controller 130 may generate and/or output the first chip select signal CS0 and/or the second chip select signal CS1. According to some example embodiments, as used herein, activating a chip select signal may refer to outputting the chip select signal at a first logic state (e.g., logic low), and inactivating and/or deactivating a chip select signal may refer to outputting the chip select signal at a second logic state different from the first logic state (e.g., logic high).

Referring to FIGS. 12 and 13A, the memory controller 430 may write data to the memory devices 410-1 to 410-4 and 420-1 to 420-4 (S310). The memory controller 430 may activate a first chip select signal CS0 to select the first memory devices 410-1 to 410-4. Simultaneously or contemporaneously, the memory controller 430 may activate a second chip select signal CS1 to select the second memory devices 420-1 to 420-4. Thus, a writing operation with respect to the first memory devices 410-1 to 410-4, classified as the first rank RANK0, and a writing operation with respect to the second memory devices 420-1 to 420-4, classified as the second rank RANK1, may be simultaneously or contemporaneously performed.

For example, when a command to write first data to fourth data is received from the host, the memory controller 430 may write the first data to each of the first memory device 410-1 and the second memory device 420-1. By the same principle, the memory controller 430 may write the second data to each of the first memory device 410-2 and the second memory device 420-2, may write the third data to each of the first memory device 410-3 and the second memory device 420-3, and may write the fourth data to each of the first memory device 410-4 and the second memory device 420-4.

Referring to FIGS. 12 and 13B, the memory controller 430 may read data from the first memory devices 410-1 to 410-4 classified as the first rank RANK0 (S320). The memory controller 430 may activate a first chip select signal CS0 to select the first memory devices 410-1 to 410-4. Simultaneously or contemporaneously, the memory controller 430 may inactivate a second chip select signal CS1 not to select the second memory devices 420-1 to 420-4.

Thus, a read operation with respect to the first memory devices 410-1 to 410-4, classified as the first rank RANK0, is performed, while a read operation with respect to the second memory devices 420-1 to 420-4, classified as the second rank RANK1, may not be performed.

Referring to FIGS. 12 and 13C, a memory controller 430 may detect whether the UECC has occurred in the first memory devices 410-1 to 410-4 (S330). For example, a method of confirming whether the UECC has occurred in the first memory devices 410-1 to 410-4 by the memory controller 130 may be a single bit error correcting double bit error detection (SEDEC) method.

In the case of the SEDEC, when a single bit error is detected, the memory controller 430 may directly correct the error. However, when the 2-bit error is detected, the memory controller 430 may notify the user of the 2-bit error and stop an operation of the memory system 100D. Moreover, when the 3-bit or more error is detected, the firmware of the memory controller 430 may check for abnormal signs.

When the UECC has occurred in the first memory devices 410-1 to 410-4, the memory controller 430 may read and/or write data using the second memory devices 420-1 to 420-4 (S340).

When the UECC does not occur in the first memory devices 410-1 to 410-4, the memory controller 430 may simultaneously or contemporaneously write data to the first memory devices 410-1 to 410-4, classified as the first rank RANK0, and the second memory devices 420-1 to 420-4, classified as the second rank RANK1 (S310). Moreover, the memory controller 430 may read data from the first memory devices 410-1 to 410-4 classified as the first rank RANK0.

According to an embodiment of the present disclosure, the memory system 400A, 400B, and 400C may include memory devices 410-1 to 410-4 and 420-1 to 420-4, configured as a multi-rank. Among the memory devices 410-1 to 410-4 and 420-1 to 420-4, the second memory devices 420-1 to 420-4 may be used as a backup region.

The memory controller 430 may simultaneously or contemporaneously write data to be written to the first memory devices 410-1 to 410-4 to the second memory devices 420-1 to 420-4. Thus, even when the UECC has occurred in a memory region of the first memory devices 410-1 to 410-4, the memory system 400A, 400B and/or 400C may perform a failover function using the data stored in the second memory devices 420-1 to 420-4.

Moreover, when the second memory devices 420-1 to 420-4 are used as a backup region, the MTBF may increase two times when compared to the use of only the first memory devices 410-1 to 410-4. Thus, reliability of the memory system may be secured two times. For example, the MTBF may be 200 million hours when the first memory devices 410-1 to 410-4 are only used. Meanwhile, the MTBF may be 400 million hours when the second memory devices 420-1 to 420-4 are used as a backup region together with the first memory devices 410-1 to 410-4.

Figure 14:
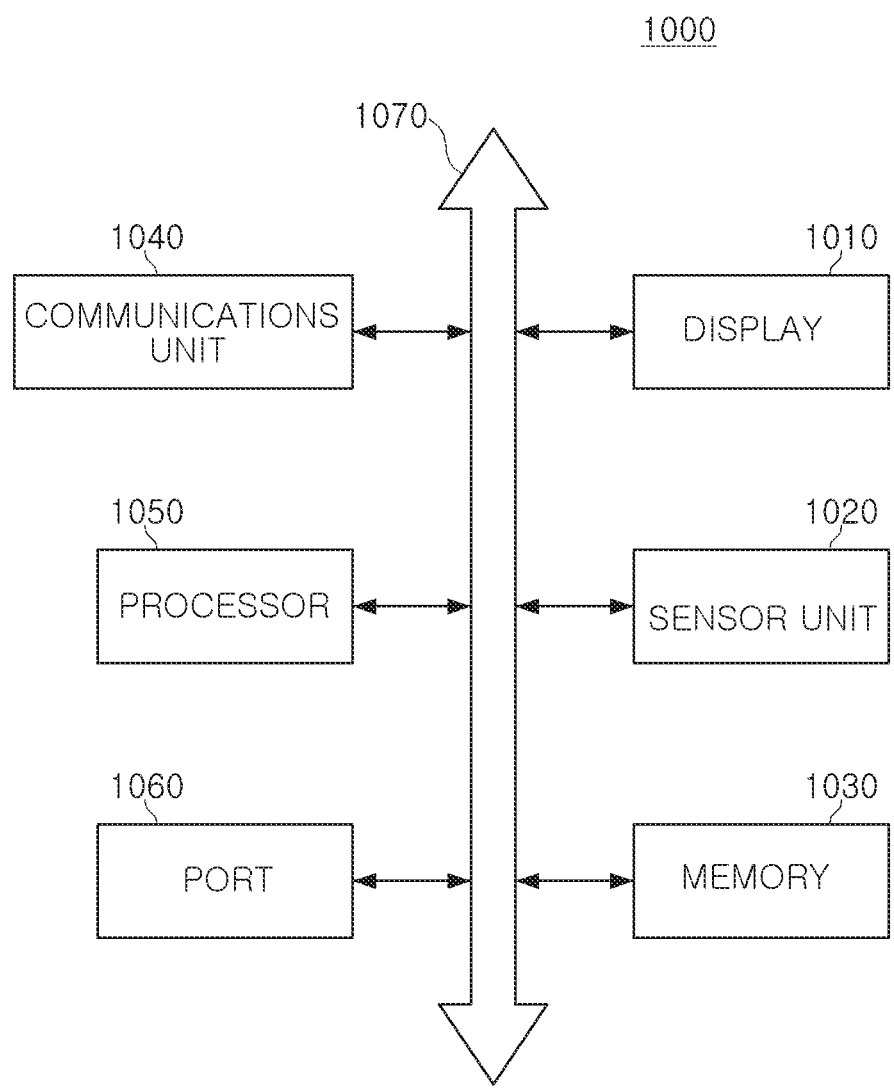
FIG. 14 is a schematic block diagram illustrating an electronic device including a memory device according to an example embodiment.

FIG. 14 is a schematic block diagram illustrating an electronic device including a memory device according to an example embodiment.

An electronic device 1000 according to an example embodiment illustrated in FIG. 14 includes a display 1010, a sensor unit 1020, a memory 1030, a communications unit 1040, processing circuitry 1050 (e.g., at least one processor), and/or a port 1060. The electronic device 1000 may further include a power supply, an input and/or output device, and/or the like. Among components illustrated in FIG. 14, the port 1060 may be provided for the electronic device 1000 to communicate with a video card, a sound card, a memory card, a universal serial bus (USB) device, and/or the like. The electronic device 1000 may be a concept including a smartphone, a tablet PC, a smart wearable device, and/or the like, as well as a desktop computer and/or a laptop computer according to the related art.

The processing circuitry 1050 may perform a certain operation, a command, a task, and/or the like. The processing circuitry 1050 may be a central processing unit (CPU), a microprocessor unit (MCU), a System on Chip (SoC), and/or the like, and may communicate with the display 1010, the sensor unit 1020, the memory 1030, the communications unit 1040, and/or other devices connected to the port 1060 through a bus 1070.

The memory 1030 may be a storage medium storing data to be used for an operation of the electronic device 1000, and/or multimedia data. The memory 1030 may include a volatile memory such as a random access memory (RAM) and/or a non-volatile memory such as a flash memory. In addition or alternatively, the memory 1030 may include at least one of a solid state drive (SSD), a hard disk drive (HDD), and/or an optical disk drive (ODD), as a storage device. In an embodiment illustrated in FIG. 14, the memory 1030 may be implemented as a memory device or a memory package according to various example embodiments described with respect to FIGS. 1 to 13 previously.

As set forth above, according to example embodiments of the present inventive concepts, at least one of memory devices may include a backup region, and a memory controller may determine a memory region having the high probability of occurrence of the UECC. The memory controller may store data in each of the memory region and the backup region, when the data is written to the memory region. Thus, the memory system may have an effect of performing a failover function.

While example embodiments have been shown and described above, it will be apparent to those skilled in the art that modifications and variations could be made without departing from the scope of the present disclosure, as defined by the appended claims.

What is claimed is:

1. A memory system, comprising:
a plurality of memory devices, each of the plurality of memory devices including a plurality of memory cells, and at least one of the plurality of memory devices including a backup region; and
a memory controller configured to,
store data in both a plurality of selected memory cells and the backup region in response to a correctable error correction code (CECC) occurring in at least one of the plurality of selected memory cells, the plurality of selected memory cells being connected to a selected word line of a selected memory device among the plurality of memory devices, and
replace the selected word line with a redundancy word line to which a plurality of redundancy memory cells among the plurality of memory cells are connected in response to the CECC occurring in the at least one of the plurality of selected memory cells.

2. The memory system of claim 1, wherein the memory controller is configured to store the data stored in the backup region in the plurality of redundancy memory cells.

3. The memory system of claim 1, wherein the backup region is included in a same bank as the selected word line.

4. The memory system of claim 1, wherein the backup region and the selected word line are included in different banks.

5. The memory system of claim 1, wherein the memory controller is configured to:
store an address of a region in which the CECC has occurred and a count of the region, and
store the data in both the selected memory cells and the backup region in response to determining the count is greater than a reference count.

6. The memory system of claim 5, wherein the address includes a bank address, a row address, and a column address.

7. The memory system of claim 5, wherein the address indicates a defective memory cell among the plurality of selected memory cells in which the CECC has occurred, and the selected word line is connected to the defective memory cell.

8. A memory system, comprising:
a plurality of memory devices, each of the plurality of memory devices including a plurality of memory cells, and at least one of the plurality of memory devices including a backup region; and
a memory controller configured to,
store data in both of a selected word line and the backup region in response to a first region having a high access count, a plurality of selected memory cells being connected to the selected word line, the selected word line being included in the first region of a selected memory device among the plurality of memory devices, and
replace the selected word line with a redundancy word line to which a plurality of redundancy memory cells among the plurality of memory cells are connected in response to the first region having the high access count.

9. The memory system of claim 8, wherein the memory controller is configured to store the data stored in the backup region in the redundancy word line.

10. The memory system of claim 8, wherein the backup region is included in a same bank as the first region.

11. The memory system of claim 8, wherein the backup region and the first region are included different banks.

12. The memory system of claim 8, wherein the memory controller is configured to:
   read an address of a region with a highest access count among a plurality of memory regions in each of the plurality of memory devices and an access count of the region with a highest access count, and
   store data in both of the selected word line and the backup region in response to the access count being greater than a reference count.

13. The memory system of claim 12, wherein the memory controller is configured to read the address and the access count by mode register read (MRR).

* * * * *